United States Patent
Ise et al.

(10) Patent No.: US 7,560,174 B2
(45) Date of Patent: *Jul. 14, 2009

(54) ORGANIC ELECTROLUMINESCENT DEVICE

(75) Inventors: Toshihiro Ise, Minami-Ashigara (JP); Tatsuya Igarashi, Minami-Ashigara (JP); Hisashi Okada, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 581 days.

This patent is subject to a terminal disclaimer.

(21) Appl. No.: 10/530,025

(22) PCT Filed: Dec. 17, 2003

(86) PCT No.: PCT/JP03/16195

§ 371 (c)(1),
(2), (4) Date: Apr. 1, 2005

(87) PCT Pub. No.: WO2004/055130

PCT Pub. Date: Jul. 1, 2004

(65) Prior Publication Data

US 2006/0052607 A1    Mar. 9, 2006

(30) Foreign Application Priority Data

Dec. 17, 2002    (JP)    .............................. 2002-365280

(51) Int. Cl.
*H01L 51/50*    (2006.01)
*C07F 3/00*    (2006.01)

(52) U.S. Cl. .......................... 428/690; 546/10; 428/917; 428/704

(58) Field of Classification Search ................... 546/10; 428/690, 704, 917

See application file for complete search history.

(56) References Cited

U.S. PATENT DOCUMENTS

| | | | |
|---|---|---|---|
| 6,358,634 | B1 | 3/2002 | Igarashi et al. |
| 7,179,544 | B2* | 2/2007 | Ise et al. ..................... 428/690 |
| 7,291,405 | B2* | 11/2007 | Igarashi et al. ............. 428/690 |
| 2002/0096995 | A1 | 7/2002 | Mishima et al. |

FOREIGN PATENT DOCUMENTS

| | | | |
|---|---|---|---|
| JP | 9-328678 A | 12/1997 |
| JP | 2002-305083 A | 10/2002 |

* cited by examiner

*Primary Examiner*—Charanjit S Aulakh
(74) *Attorney, Agent, or Firm*—Birch, Stewart, Kolasch & Birch, LLP

(57) ABSTRACT

An organic electroluminescent device comprising: a pair of electrode; and at least one organic layer between the pair of electrode, the at least one organic layer including a luminescent layer, wherein the luminescent layer contains at least one phosphorescent material and at least one compound represented by the formula (I) defined herein.

4 Claims, No Drawings

ORGANIC ELECTROLUMINESCENT DEVICE

TECHNICAL FIELD

The present invention relates to an organic electro-luminescent device (organic EL device) having high luminance and high luminous efficiency and excellent durability.

BACKGROUND ART

An organic EL device is constituted of counter electrodes having a luminescent layer and a plurality of organic layers containing a luminescent layer put therebetween. The organic EL device is a device for obtaining luminescence utilizing either one of luminescence from excitons formed by recombination of electrons injected from a cathode and holes injected from an anode in a luminescent layer, or luminescence from excitons of other molecule formed by energy transfer from the foregoing excitons.

An invention directed to a phosphorescent organic EL element using a metal complex as a host material is disclosed (see JP-A-2002-305083). However, it is the present state that its luminous efficiency and durability are not yet sufficient, and hence, development of devices exhibiting higher luminance and luminous efficiency and having excellent durability is eagerly demanded.

DISCLOSURE OF THE INVENTION

Accordingly, an object of the invention is to provide a luminescent device exhibiting higher luminance and luminous efficiency and having excellent durability.

The foregoing problem has been attained as follows.

(1) An organic electroluminescent device comprising a pair of electrode and at least one organic layer including a luminescent layer therebetween, the luminescent layer containing at least one phosphorescent material and at least one compound represented by the following formula (I).

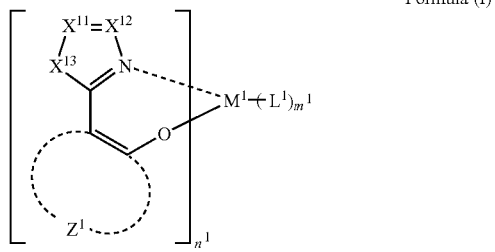

Formula (I)

In the formula (I), $X^{11}$ represents a nitrogen atom or $C-R^{11}$; $X^{12}$ represents a nitrogen atom or $C-R^{12}$; $R^{11}$ and $R^{12}$ each represents an aryl group or an atomic group necessary for forming a heterocycle upon connection of $R^{11}$ and $R^{12}$; $X^{13}$ represents an oxygen atom, a sulfur atom, $-C(R^{13})R^{14}-$, or $-NR^{15}-$; $R^{13}$, $R^{14}$, and $R^{15}$ each represents a hydrogen atom or a substituent; $Z^1$ represents an atomic group necessary for forming a 5-membered or 6-membered ring; $M^1$ represents a metal ion; $n^1$ represents an integer of 1 or more; $L^1$ represents a ligand; and $m^1$ represents an integer of 0 or more.

(2) The organic electroluminescent device as set forth above in (1), wherein the compound represented by the formula (I) is the major component in the luminescent layer.

(3) The organic electroluminescent device as set forth above in (1) or (2), wherein the compound represented by the formula (I) is a compound represented by the following formula (II).

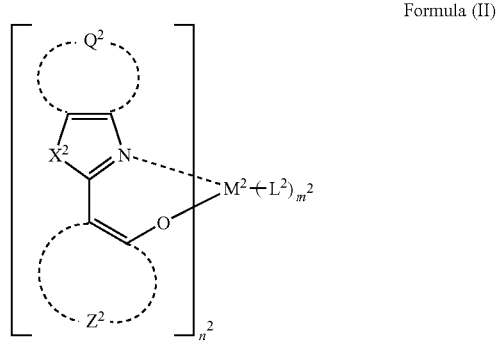

Formula (II)

In the formula (II), $Q^2$ represents an atomic group necessary for forming a heterocycle; $X^2$ represents an oxygen atom, a sulfur atom, $-C(R^{21})R^{22}-$, or $-NR^{23}-$. $R^{21}$, $R^{22}$, and $R^{23}$ each represents a hydrogen atom or a substituent; $Z^2$ represents an atomic group necessary for forming a 5-membered or 6-membered ring; $M^2$ represents a metal ion; $n^2$ represents an integer of 1 or more; $L^2$ represents a ligand; and $m^2$ represents an integer of 0 or more.

(4) The organic electroluminescent device as set forth above in any one of (1) to (3), wherein the compound represented by the formula (I) is a compound represented by the following formula (III).

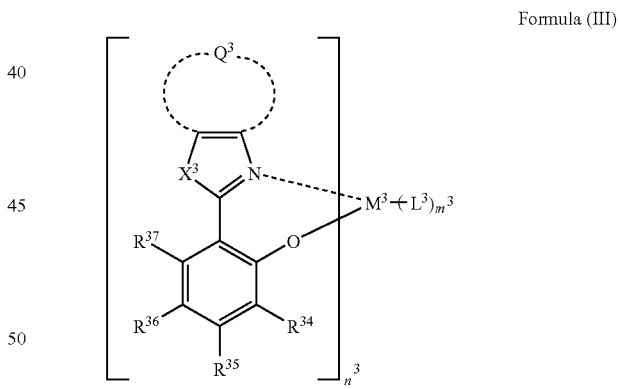

Formula (III)

In the formula (III), $Q^3$ represents an atomic group necessary for forming a 6-membered nitrogen-containing heterocycle; $X^3$ represents an oxygen atom, a sulfur atom, $-C(R^{31})R^{32}-$, or $-NR^{33}-$; $R^{31}$, $R^{32}$, and $R^{33}$ each represents a hydrogen atom or a substituent; $R^{34}$, $R^{35}$, $R^{36}$, and $R^{37}$ each represents a hydrogen atom or a substituent; $M^3$ represents a metal ion; $n^3$ represents an integer of 1 or more; $L^3$ represents a ligand; and $m^3$ represents an integer of 0 or more.

(5) The organic electroluminescent device as set forth above in any one of (1) to (4), wherein the compound represented by the formula (I) is a compound represented by the following formula (IV).

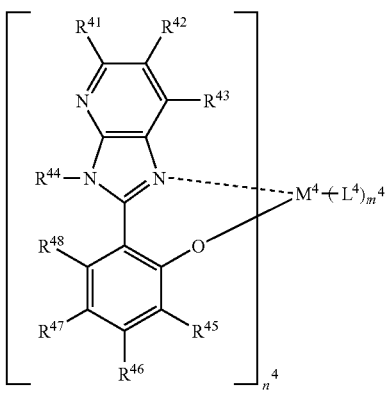

Formula (IV)

In the formula (IV), $R^{41}$, $R^{42}$, $R^{43}$, $R^{44}R^{45}$, $R^{46}R^{47}$, and $R^{48}$ each represents a hydrogen atom or a substituent; $M^4$ represents a divalent or trivalent metal ion; $n^4$ represents an integer of from 1 to 3; $L^4$ represents a ligand; and $m^4$ represents an integer of from 0 to 2.

(6) An organic electroluminescent device comprising a pair of electrode and at least one organic layer including a luminescent layer therebetween, the luminescent layer containing at least one phosphorescent material and at least one compound represented by the following formula (V):

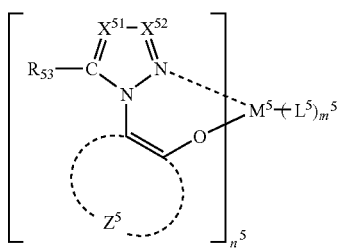

Formula (V)

In the formula (V), $X^{51}$ represents a nitrogen atom or C—$R^{51}$—; $X^{52}$ represents a nitrogen atom or C—$R^{52}$; $R^{51}$ and $R^{52}$ each represents a hydrogen atom or a substituent; $R^{53}$ represents a hydrogen atom or a substituent; $Z^5$ represents an atomic group necessary for forming a 5-membered or 6-membered ring; $M^5$ represents a metal ion; and $n^5$ represents an integer of 1 or more; $L^5$ represents a ligand; and $m^5$ represents an integer of 0 or more.

(7) The organic electroluminescent device as set forth in any one of (1) to (5), wherein, in addition to the compound represented by the formula (I) and a phosphorescent material, at least another material is contained in the luminescent layer.

(8) The organic electroluminescent device set forth in any one of (1) to (5), wherein, in addition to a compound represented by general formula (V) and a phosphorescent material, at least another material is contained in the luminescent layer.

The organic EL device of the invention will be described below in detail. The organic EL device of the invention is an organic electroluminescent device comprising a pair of electrode and at least one organic layer including a luminescent layer therebetween, the luminescent layer containing at least one phosphorescent material and at least one compound represented by the formula (I) or formula (V). Also, in addition to the luminescent layer, a hole injection layer, a hole transport layer, an electron transport layer, an electron injection layer, a protective layer, and the like may be disposed between the pair of electrodes. These respective layers may have other functions at the same time.

In the organic EL device of the invention, it is preferable that the compound represented by the formula (I) or formula (V) functions as a host material. The host material is a material other than a luminescent material (phosphorescent material in the invention) among materials of forming the luminescent layer and means a material having at least one function of the following functions:

A function to disperse a luminescent material (phosphorescent material in the invention) and hold it the layer;

A function to receive holes from an anode, a hole transport layer, etc.;

A function to receive electrons from a cathode, an electron transport layer, etc.;

A function to transport holes and/or electrons;

A function to provide a field of recombination of holes and electrons;

A function to transfer energy of excitons formed by recombination into a luminescent material; and A function to transport holes and/or electrons into a luminescent material.

The host material is preferably a material having at least one function of a function to transport holes and/or electrons and a function to transfer energy of excitons formed by recombination, and more preferably a material having at least two functions among the foregoing various functions. Further, the compound represented by the formula (I) or formula (V) may have the foregoing various functions other than the function to transport holes or electrons and a function to transfer energy of excitons formed by recombination at the same time.

It is preferable that the compound represented by the formula (I) or formula (V) is the major component in the luminescent layer. For the reason that the compound functions as a host material, it is more preferable that the compound represented by the formula (I) or formula (V) is the major component. More concretely, the content of the compound represented by the formula (I) or formula (V) is preferably from 50% to 99.9% by weight, and more preferably from 60% to 99% by weight.

In order that the host material may be electrochemically oxidized or reduced in accomplishing the foregoing function or functions, it is preferable that the host material is very stable against electrochemical oxidation and reduction. In other words, it is preferable that an oxidation species (such as a radical cation species) and a reduction species (such as a radical anion species) are very stable. Also, in the case where recombination is carried out with the host material, since excitons of the host material are first formed, it is preferable that the excitation state of the host material is stable without causing decomposition or heat deactivation. That is, this means that a host material that is also stable against light is preferable. Further, in organic EL devices, since film breakage or material decomposition caused by heat generation during driving is a large factor of degradation, it is also preferable that the host material is a material capable of keeping a stable amorphous film even at high temperatures without causing decomposition due to heat.

As the foregoing host material, ones that are extremely stable against light, heat and electrochemical oxidation and reduction are preferable. In the case where a host material that meets these requirements is used, it can be expected that durability of the luminescent device is extremely improved.

In the case where the durability of the luminescent device is taken into consideration, in the invention, the compound of the formula (I) or formula (V) preferably has a glass transition temperature (Tg) of from 130° C. to 400° C., more preferably from 135° C. to 400° C., further preferably from 140° C. to 400° C., especially preferably from 150° C. to 400° C., and most preferably from 160° C. to 400° C. Tg can be confirmed by heat measurement such as differential scanning calorimetry (DSC) and differential thermal analysis (DTA), X-ray diffraction (XRD), polarizing microscopic observation, etc.

In the invention, the compound of the formula (I) or formula (V) is a metal complex (which is synonymous with the metal complex of the invention), and preferably a host material. Though a metal species of the metal complex is not particularly limited, it is preferably a metal belonging to the groups 2 to 4 of the periodic table; more preferably Li, Be, Na, Mg, Al, K, Ca, Sc, Ti, V, Cr, Mn, Fe, Co, Ni, Cu, Zn, Ga, or Ge; more preferably Li, Be, Na, Mg, Al, Ti, Fe, Co, Li, Cu, Zn, or Ga; further preferably Be, Mg, Al, Fe, Ni, Cu, Ga, or Zn; even further preferably Be, Mg, Al, Cu, Ga, or Zn; and especially preferably Al, Ga or Zn.

The metal complex of the invention may be a polynuclear complex having a plurality of metal ions in the same molecule. Also, the metal complex may be a polynuclear complex comprising a plurality of metals. Also, the metal complex may have a plurality of ligands. It is preferable that the metal complex of the invention is a neutral metal complex.

A preferred first embodiment of the organic EL device of the invention is an embodiment containing a compound represented by the formula (I) in the luminescent layer, which preferably functions as a host material. In the formula (I), $X^{11}$ represents a nitrogen atom or C—$R^{11}$. $X^{12}$ represents a nitrogen atom or C—$R^{12}$. $R^{11}$ and $R^{12}$ each represents an aryl group or are connected to each other to form a heterocycle. $X^{13}$ represents an oxygen atom, a sulfur atom, —C($R^{13}$)$R^{14}$—, or —N$R^{15}$—. $R^{13}$, $R^{14}$, and $R^{15}$ each represents a hydrogen atom or a substituent. $Z^1$ represents an atomic group necessary for forming a 5-membered or 6-membered ring. $M^1$ represents a metal ion. $n^1$ represents an integer of 1 or more. $L^1$ represents a ligand. $m^1$ represents an integer of 0 or more.

The compound represented by the formula (I) will be described below in detail. $X^{11}$ represents a nitrogen atom or C—$R^{11}$; and $X^{12}$ represents a nitrogen atom or C—$R^{12}$. $R^{11}$ and $R^{12}$ each represents an aryl group or an atomic group necessary for forming a heterocycle upon connection between $R^{11}$ and $R^{12}$.

In the case where $R^{11}$ and $R^{12}$ each represents an aryl group, examples of the aryl group include a phenyl group, a naphthyl group, a pyridyl group, a pyrimidinyl group, a pyridazinyl group, a pyrazinyl group, a thienyl group, a furyl group, and a pyrrolyl group. Of these groups, a phenyl group and a pyridyl group are preferable, and a phenyl group is more preferable.

In the case where $R^{11}$ and $R^{12}$ are connected to each other to form a heterocycle, examples of the heterocycle to be formed include a pyridine ring, a pyrazine ring, a pyrimidine ring, a pyridazine ring, a triazine ring, a thiophene ring, a furan ring, a pyrrole ring, an imidazole ring, an oxazole ring, a thiazole ring, and triazole ring. Of these rings, a pyridine ring, a pyrazine ring, and a pyrimidine ring are preferable; a pyridine ring and a pyrazine ring are more preferable; and a pyridine ring is further preferable. In the case where $R^{11}$ and $R^{12}$ are connected to each other to form a heterocycle, the heterocycle may form a fused ring with other ring.

Each of the aryl group represented by $R^{11}$ and $R^{12}$ and the heterocycle formed upon connection between $R^{11}$ and $R^{12}$ may further have a substituent, examples of which include ones of the following substituent group A.

(Substituent Group A)

Examples include an alkyl group (preferably ones having from 1 to 20 carbon atoms, more preferably from 1 to 12 carbon atoms, and especially preferably from 1 to 8 carbon atoms, such as a methyl group, an ethyl group, an isopropyl group, a t-butyl group, an n-octyl group, an n-decyl group, an n-hexadecyl group, a cyclopropyl group, a cyclopentyl group, and a cyclohexyl group), an alkenyl group (preferably ones having from 2 to 20 carbon atoms, more preferably from 2 to 12 carbon atoms, and especially preferably from 2 to 8 carbon atoms, such as a vinyl group, an allyl group, a 2-butenyl group, and a 3-pentenyl group), an alkynyl group (preferably ones having from 2 to 20 carbon atoms, more preferably from 2 to 12 carbon atoms, and especially preferably from 2 to 8 carbon atoms, such as a propargyl group and a 3-pentynyl group), an aryl group (preferably ones having from 6 to 30 carbon atoms, more preferably from 6 to 20 carbon atoms, and especially preferably from 6 to 12 carbon atoms, such as a phenyl group, a p-methylphenyl group, and a naphthyl group), a substituted carbonyl group (preferably ones having from 1 to 20 carbon atoms, more preferably from 1 to 16 carbon atoms, and especially preferably from 1 to 12 carbon atoms, such as an acetyl group, a benzoyl group, a methoxycarbonyl group, a phenyloxycarbonyl group, a dimethylaminocarbonyl group, and a phenylaminocarbonyl group), an amino group (preferably ones having from 0 to 20 carbon atoms, more preferably from 1 to 16 carbon atoms, and especially preferably from 1 to 12 carbon atoms, such as a dimethylamino group, a methylcarbonylamino group, an ethylsulfonylamino group, a dimethylaminocarbonylamino group, and a phthalimide group), a sulfonyl group (preferably ones having from 1 to 20 carbon atoms, more preferably from 1 to 16 carbon atoms, and especially preferably from 1 to 12 carbon atoms, such as a mesyl group and a tosyl group), a sulfo group, a carboxyl group, a heterocyclic group (including an aliphatic heterocyclic group and an aromatic heterocyclic group, which preferably contains any one of an oxygen atom, a sulfur atom, and a nitrogen atom; preferably ones having from 1 to 50 carbon atoms, more preferably from 1 to 30 carbon atoms, and especially preferably from 2 to 12 carbon atoms, such as an imidazoyl group, a pyridyl group, a furyl group, a piperidyl group, a morpholino group, a benzoxazolyl group, and a triazolyl group), a hydroxyl group, an alkoxy group (preferably ones having from 1 to 20 carbon atoms, more preferably from 1 to 16 carbon atoms, and especially preferably from 1 to 12 carbon atoms, such as a methoxy group and a benzyloxy group), an aryloxy group (preferably ones having from 6 to 20 carbon atoms, more preferably from 6 to 16 carbon atoms, and especially preferably from 6 to 12 carbon atoms, such as a phenoxy group and a naphthyloxy group), a halogen atom (preferably a fluorine atom, a chlorine atom, a bromine atom, and an iodine atom), a thiol group, an alkylthio group (preferably ones having from 1 to 20 carbon atoms, more preferably from 1 to 16 carbon atoms, and especially preferably from 1 to 12 carbon atoms, such as a methylthio group), an arylthio group (preferably ones having from 6 to 20 carbon atoms, more preferably from 6 to 16 carbon atoms, and especially preferably from 6 to 12 carbon atoms, such as a phenylthio group), a cyano group, and a silyl group (preferably ones having from 0 to 40 carbon atoms, more preferably from 3 to 30 carbon atoms, and especially preferably from 3 to 18 carbon atoms, such as a trimethylsilyl group, a triphenylsilyl group, and a t-butyldiphenylsilyl group).

$X^{13}$ represents an oxygen atom, a sulfur atom, —C($R^{13}$)$R^{14}$—, or —N$R^{15}$—. $R^{13}$, $R^{14}$, and $R^{15}$ each represents a hydrogen atom or a substituent. As the substituent represented by $R^{13}$ and $R^{14}$, those enumerated as the substituent to be substituted on the aryl group represented by $R^{11}$ and $R^{12}$ or on the heterocycle formed upon connection between $R^{11}$ and $R^{12}$ can be applied. $R^{13}$ an $R^{14}$ are each preferably a hydrogen atom, an alkyl group, or an aryl group; more preferably a hydrogen atom or an alkyl group; and further preferably an alkyl group.

Examples of the substituent represented by $R^{15}$ include ones of the following substituent group B.

(Substituent Group B)

Examples include an alkyl group (preferably ones having from 1 to 20 carbon atoms, more preferably from 1 to 12 carbon atoms, and especially preferably from 1 to 8 carbon atoms, such as a methyl group, an ethyl group, an isopropyl group, a t-butyl group, an n-octyl group, an n-decyl group, an n-hexadecyl group, a cyclopropyl group, a cyclopentyl group, and a cyclohexyl group), an alkenyl group (preferably ones having from 2 to 20 carbon atoms, more preferably from 2 to 12 carbon atoms, and especially preferably from 2 to 8 carbon atoms, such as a vinyl group, an allyl group, a 2-butenyl group, and a 3-pentenyl group), an alkynyl group (preferably ones having from 2 to 20 carbon atoms, more preferably from 2 to 12 carbon atoms, and especially preferably from 2 to 8 carbon atoms, such as a propargyl group and a 3-pentynyl group), an aryl group (preferably ones having from 6 to 30 carbon atoms, more preferably from 6 to 20 carbon atoms, and especially preferably from 6 to 12 carbon atoms, such as a phenyl group, a p-methylphenyl group, and a naphthyl group), a substituted carbonyl group (preferably ones having from 1 to 20 carbon atoms, more preferably from 1 to 16 carbon atoms, and especially preferably from 1 to 12 carbon atoms, such as an acetyl group, a benzoyl group, a methoxycarbonyl group, a phenyloxycarbonyl group, a dimethylaminocarbonyl group, and a phenylaminocarbonyl group), a substituted sulfonyl group (preferably ones having from 1 to 20 carbon atoms, more preferably from 1 to 16 carbon atoms, and especially preferably from 1 to 12 carbon atoms, such as a mesyl group and a tosyl group), and a heterocyclic group (including an aliphatic heterocyclic group and an aromatic heterocyclic group, which preferably contains any one of an oxygen atom, a sulfur atom, and a nitrogen atom; preferably ones having from 1 to 50 carbon atoms, more preferably from 1 to 30 carbon atoms, and especially preferably from 2 to 12 carbon atoms, such as an imidazoyl group, a pyridyl group, a furyl group, a piperidyl group, a morpholino group, a benzoxazolyl group, and a triazolyl group). $R^{15}$ is preferably an alkyl group, an aryl group, or an aromatic heterocyclic group; more preferably an alkyl group or an aryl group; and further preferably an aryl group.

$Z^1$ represents an atomic group necessary for forming a 5-membered or 6-membered ring including an atom to which a dotted line in the formula is bound. The $Z^1$-containing ring may contain a substituent (as the substituent, those enumerated as the substituent to be substituted on the aryl group represented by $R^{11}$ and $R^{12}$ or on the heterocyclic ring formed upon connection between $R^{11}$ and $R^{12}$ can be applied) or may be fused with other ring.

Examples of the $Z^1$-containing ring include cyclopentene, cyclohexene, benzene, naphthalene, anthracene, phenanthrene, pyrene, perylene, pyridine, quinoline, furan, thiophene, pyrazine, pyrimidine, thiazole, benzothiazole, naphthothiazole, oxazole, benzoxazole, naphthoxazole, isoxazole, selenazole, benzoselenazole, naphthoselenazole, imidazole, benzoimidazole, naphthoimidazole, isoquinoline, pyrazole, and triazole. The $Z^1$-containing ring is preferably an aromatic group. Examples include benzene, naphthalene, anthracene, pyridine, thiophene, pyrazine, and pyrimidine. Of these, benzene and naphthalene are more preferable, and benzene is further preferable.

$M^1$ represents a metal ion. Though the metal ion is not particularly limited, it is preferably an ion of a metal belonging to the group 2 to group 4 of the periodic table (long form of the periodic table); more preferably a divalent or trivalent metal ion; further preferably $Be^{2+}$, $Mg^{2+}$, $Al^{3+}$, $Zn^{2+}$, $Ga^{3+}$, or $Cu^{2+}$; and especially preferably $Al^{3+}$ or $Zn^{2+}$ or $Ga^{3+}$.

$L^1$ represents a monodentate, a bidentate or multidentate ligand. Examples of the ligand include a halogen ion (such as $Cl^-$, $Br^-$, and $I^-$), a perchlorate ion, an alkoxy ion (preferably ones having from 1 to 20 carbon atoms, more preferably from 1 to 10 carbon atoms, and further preferably from 1 to 5 carbon atoms, such as a methoxy ion, an ethoxy ion, an isopropoxy ion, and an acetylacetonato ion), an aryloxy ion (preferably ones having from 6 to 20 carbon atoms, more preferably from 6 to 12 carbon atoms, and further preferably from 6 to 8 carbon atoms, such as a phenoxy ion, a quinolinol ion, and a 2-(2-hydroxyphenyl)benzoazole ion), a silyloxy ion (preferably ones having from 3 to 20 carbon atoms and more preferably from 11 to 20 carbon atoms, such as a triphenylsilyloxy ion), a nitrogen-containing heterocycle (preferably ones having from 1 to 20 carbon atoms, more preferably from 2 to 10 carbon atoms, and further preferably from 3 to 8 carbon atoms, such as phenanthlene and bipyridyl) an acyl ion (preferably ones having from 1 to 20 carbon atoms, more preferably from 2 to 10 carbon atoms, and further preferably 3 to 8 carbon atoms, such as an acetoxy ion), an ether compound (preferably ones having from 2 to 20 carbon atoms, more preferably from 3 to 10 carbon atoms, and further preferably from 3 to 8 carbon atoms, such as tetrahydrofuran) and a hydroxyl ion. Of these, an alkoxy ion, an aryloxy ion, and a silyloxy group are more preferable, and an aryloxy ion is especially preferable.

$n^1$ represents an integer of 1 or more; and $m^1$ represents an integer of 0 or more. Though the preferred range of each of $n^1$ and $m^1$ varies depending on the metal ion and is not particularly limited, $n^1$ is preferably from 1 to 4, more preferably from 1 to 3, and especially preferably 2 or 3; and $m^1$ is preferably from 0 to 2, more preferably 0 or 1, and especially preferably 0. As the combination of numbers of $n^1$ and $m^1$, a combination of numbers such that the compound represented by the formula (I) becomes a neutral complex is preferable.

The compound represented by the formula (I) is preferably a compound represented by the formula (II). In the formula (II), $Q^2$ represents an atomic group necessary for forming a heterocycle including an atom to which a dotted line in the formula is bound. $X^2$ represents an oxygen atom, a sulfur atom, —C($R^{21}$)$R^{22}$—, or —N$R^{23}$—. $R^{21}$, $R^{22}$, and $R^{23}$ each represents a hydrogen atom or a substituent. $Z^2$ represents an atomic group necessary for forming a 5-membered or 6-membered ring including an atom to which a dotted line in the formula is bound. $M^2$ represents a metal ion. $n^2$ represents an integer of 1 or more. $L^2$ represents a ligand, and $m^2$ represents an integer of 0 or more.

$Q^2$ represents an atomic group necessary for forming a heterocycle. $Q^2$ is preferably an atomic group necessary for forming a 5-membered or 6-membered heterocycle, and more preferably an atomic group necessary for forming a 5-membered or 6-membered nitrogen-containing heterocycle. As the heterocycle formed by $Q^2$, ones containing a nitrogen atom, an oxygen atom, or a sulfur atom are preferable. Examples include a pyridine ring, a pyrazine ring, a pyrimidine ring, a pyridazine ring, a triazine ring, a thiophene ring, a furan ring, a pyrrole ring, an imidazole ring, an oxazole ring, a thiazole ring, and a triazole ring. Of these rings, a pyridine ring, a pyrazine ring, and a pyrimidine ring are preferable; a pyridine ring and a pyrazine ring are more preferable; and a pyridine ring is further preferable. $Q^2$ may have a substituent (as the substituent, those enumerated as the substituent to be substituted on the aryl group represented by $R^{11}$ and $R^{12}$ or on the heterocyclic ring formed upon connection between $R^{11}$ and $R^{12}$ can be applied) or may be fused with other ring.

$X^2$, $R^{21}$, $R^{22}$, $R^{23}$, $Z^2$, $M^2$, $L^2$, $n^2$, and $m^2$ are respectively synonymous with $X^{13}$, $R^{13}$, $R^{14}$, $R^{15}$, $Z^1$, $M^1$, $L^1$, $n^1$, and $m^1$ in the formula (I), and preferred ranges thereof are also the same.

The compound represented by the formula (II) is preferably a compound represented by the formula (III). In the formula (III), $Q^3$ represents an atomic group necessary for forming a 6-membered nitrogen-containing heterocycle including an atom to which a dotted line in the formula is bound. The 6-membered nitrogen-containing heterocycle is preferably a pyridine ring, a pyrazine ring, a pyrimidine ring, a pyridazine ring, or a triazine ring; more preferably a pyridine ring, a pyrazine ring, or a pyrimidine ring; further preferably a pyridine ring or a pyrazine ring; and especially preferably a pyridine ring. $X^3$ represents an oxygen atom, a sulfur atom, —C($R^{31}$)$R^{32}$—, or —NR$^{33}$—. $R^{31}$, $R^{32}$, and $R^{33}$ each represents a hydrogen atom or a substituent. $R^{34}$, $R^{35}$, $R^{36}$, and $R^{37}$ each represents a hydrogen or a substituent. $M^3$ represents a metal ion. $n^3$ represents an integer of 1 or more. $L^3$ represents a ligand, and $m^3$ represents an integer of 0 or more.

$Q^3$, $X^3$, $R^{31}$, $R^{32}$, $R^{33}$, $M^3$, $L^3$, $n^3$, and $m^3$ are respectively synonymous with $Q^2$ in the formula (II) and $X^{13}$, $R^{13}$, $R^{14}$, $R^{15}$, $M^1$, $L^1$, $n^1$, and $m^1$ in the formula (I), and preferred ranges thereof are also the same.

$R^{34}$, $R^{35}$, $R^{36}$, and $R^{37}$ each represents a hydrogen or a substituent. These substituents may be bonded to each other to form a fused ring. As the substituent, those enumerated as the substituent to be substituted on the aryl group represented by $R^{11}$ and $R^{12}$ or on the heterocyclic ring formed upon connection between $R^{11}$ and $R^{12}$ in the formula (I) can be applied. $R^{34}$, $R^{35}$, $R^{36}$, and $R^{37}$ are each preferably a hydrogen atom, an alkyl group, an aryl group, a cyano group, a fluoro group, a perfluoro-substituted alkyl group, a heterocyclic group, an amino group, an alkoxy group, an aryloxy group, or a fused ring formed when $R^{34}$ to $R^{36}$ are bonded to each other; more preferably a hydrogen atom, an alkyl group, a fluoro group, or a perfluoro-substituted alkyl group; further preferably a hydrogen atom, an alkyl group, or a fluoro group; and especially preferably a hydrogen atom.

The compound represented by the formula (III) is preferably a compound represented by the formula (IV). In the formula (IV), $R^{41}$, $R^{42}$, $R^{43}$, $R^{44}$, $R^{45}$, $R^{46}$, $R^{47}$, and $R^{48}$ each represents a hydrogen atom or a substituent. $M^4$ represents a divalent or trivalent metal ion. $n^4$ represents an integer of from 1 to 3. $L^4$ represents a ligand; and $m^4$ represents an integer of from 0 to 2.

$R^{41}$, $R^{42}$, and $R^{43}$ each represents a hydrogen atom or a substituent. These substituents may be bonded to each other to form a fused ring. As the substituent, those enumerated as the substituent to be substituted on the aryl group represented by $R^{11}$ and $R^{12}$ or on the heterocyclic ring formed upon connection between $R^{11}$ and $R^{12}$ in the formula (I) can be applied. $R^{41}$, $R^{42}$, and $R^{43}$ are each preferably a hydrogen atom, an alkyl group, an aryl group, a cyano group, a fluoro group, a perfluoro-substituted alkyl group, a heterocyclic group, an amino group, an alkoxy group, an aryloxy group, or a fused ring formed when $R^{41}$ to $R^{43}$ are bonded to each other; more preferably a hydrogen atom or an alkyl group; and further preferably a hydrogen atom.

$R^{45}$, $R^{46}$, $R^{47}$, $R^{48}$, $R^{44}$, $M^4$, $L^4$ $n^4$, and $m^4$ are respectively synonymous with $R^{34}$, $R^{35}$, $R^{36}$, and $R^{37}$ in the formula (III) and $R^{15}$, $M^1$, $L^1$, $n^1$, and $m^1$ in the formula (I), and preferred ranges thereof are also the same.

Specific examples represented by the formulae (I) to (IV) will be given below, but it should not be construed that the invention is limited thereto.

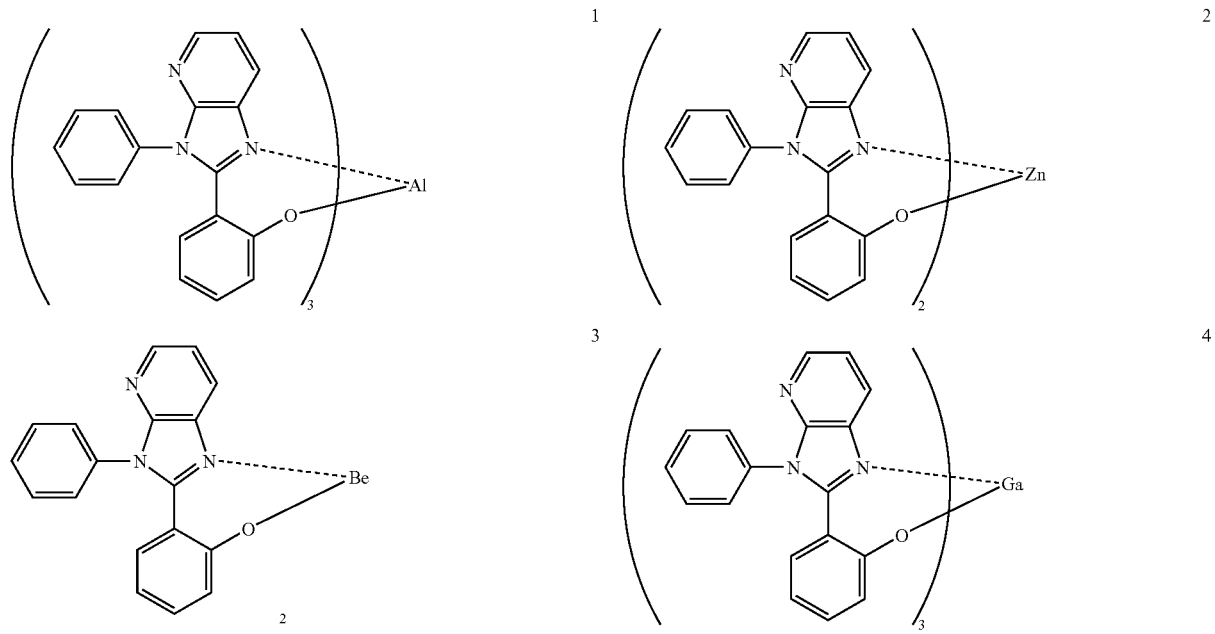

-continued
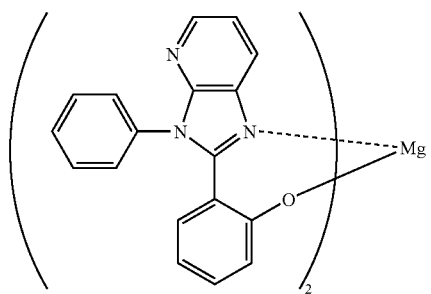
5
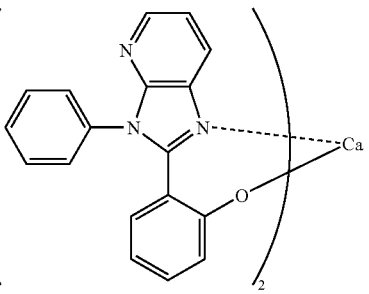
6
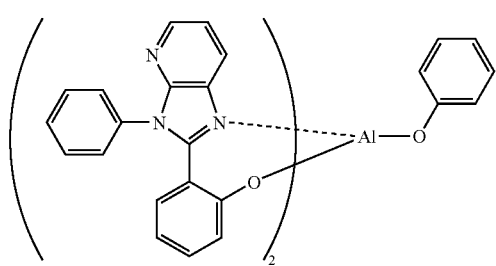
7
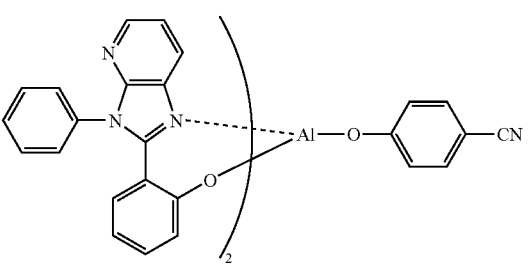
8
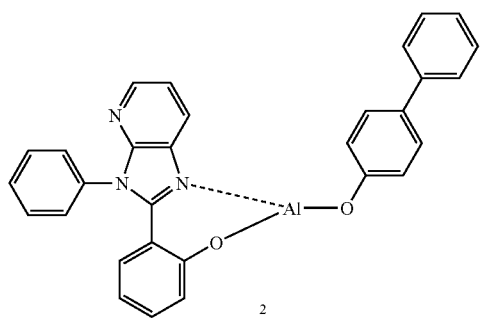
9
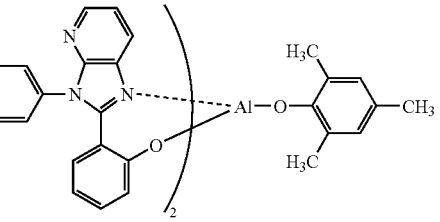
10
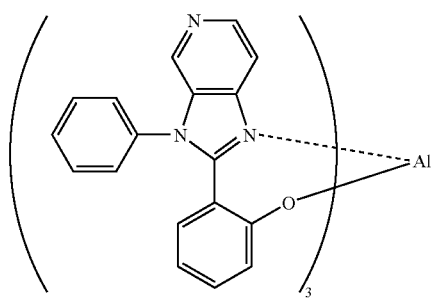
11
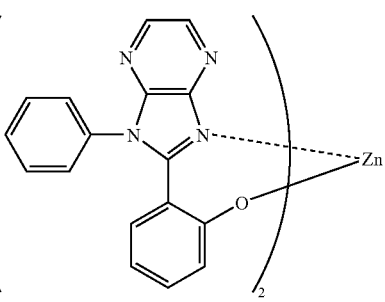
12
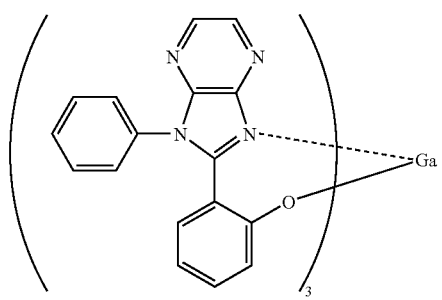
13

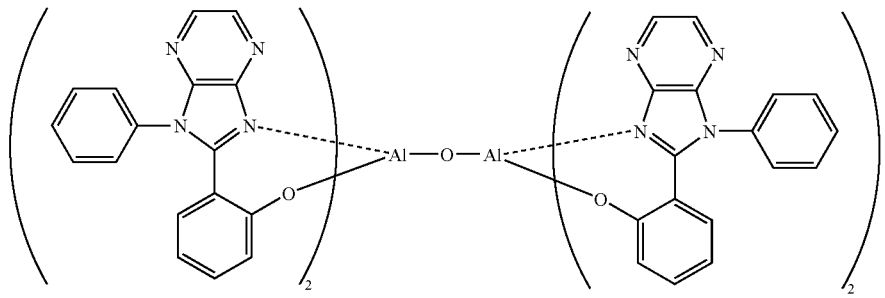
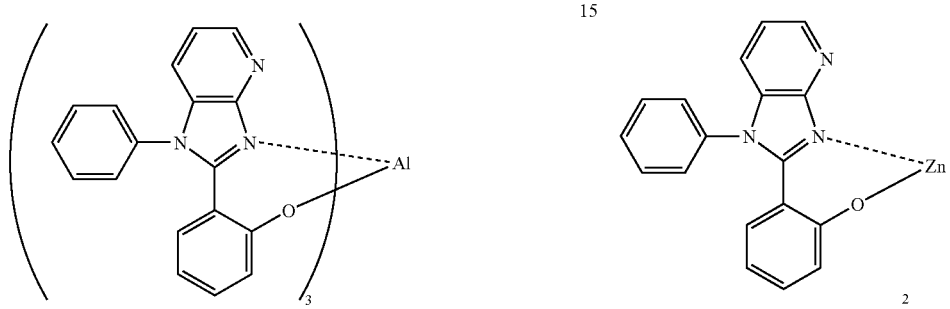
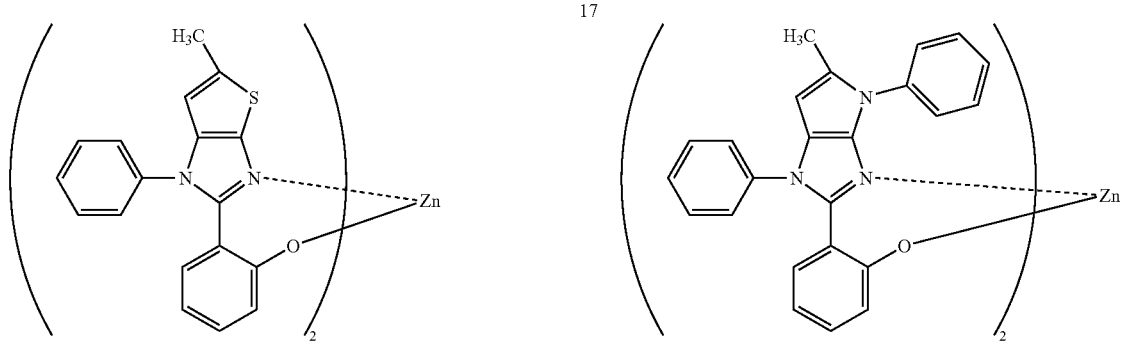
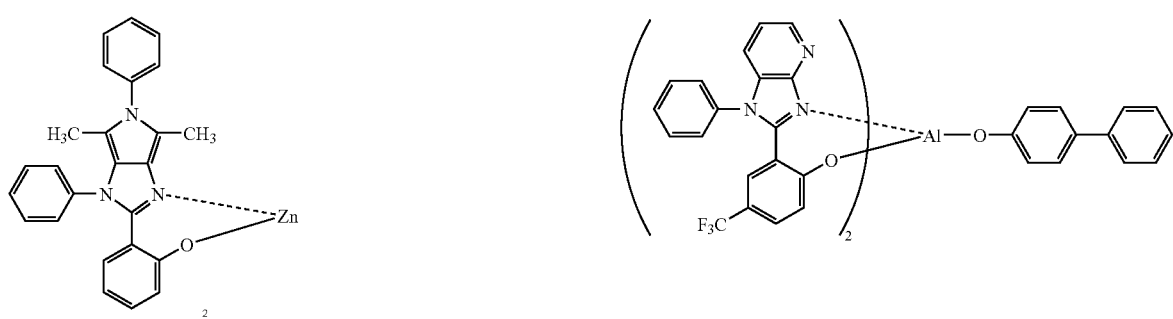
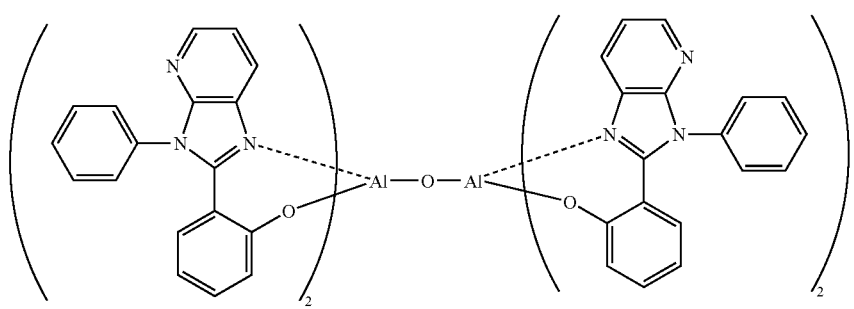

-continued
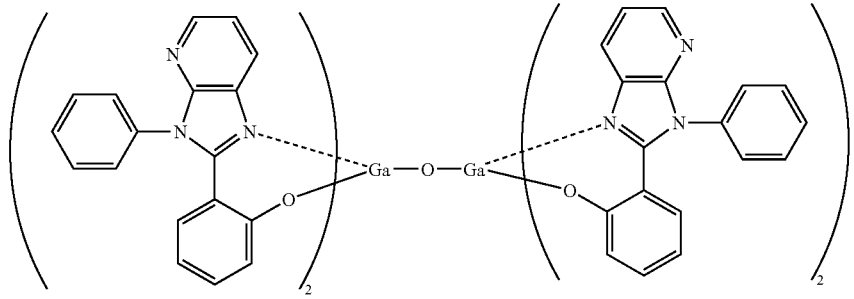
22
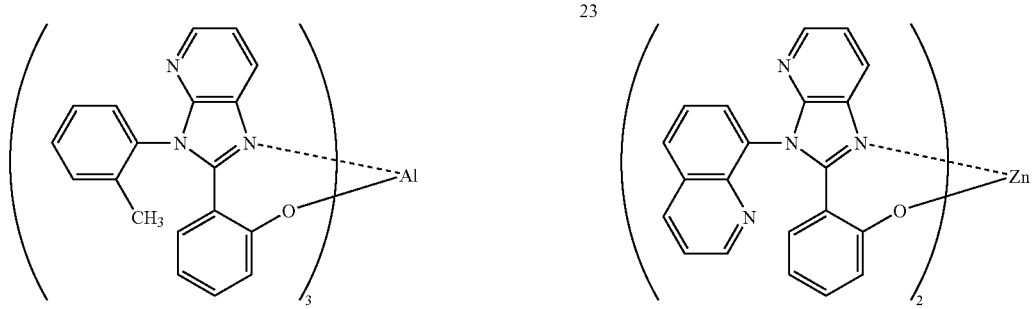
23 24
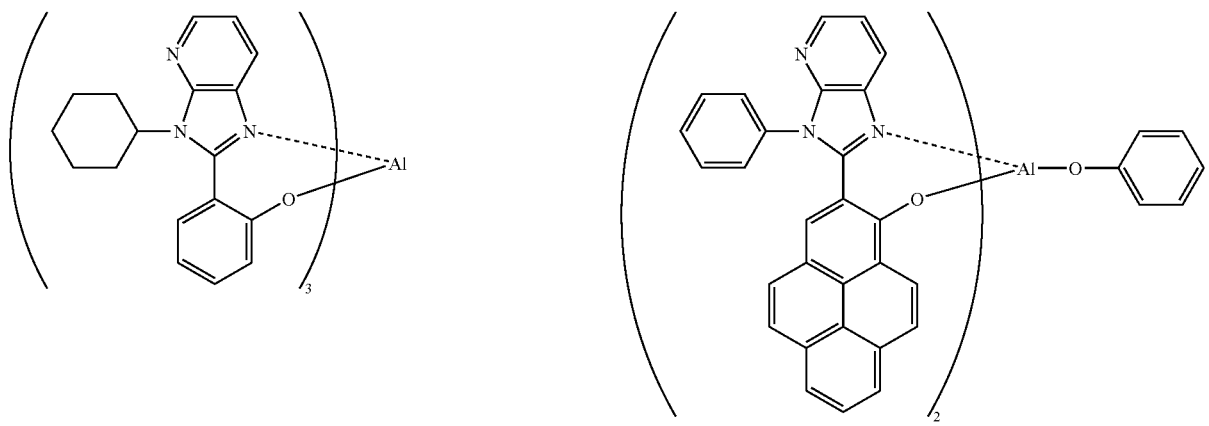
25 26
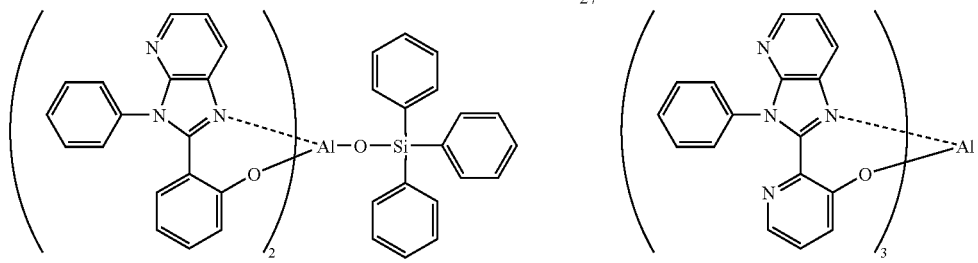
27 28

-continued
29
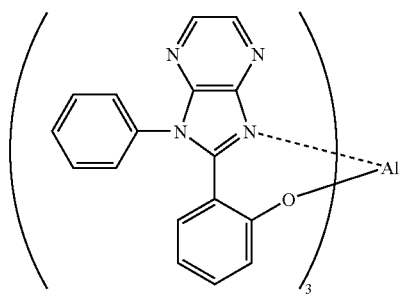
30
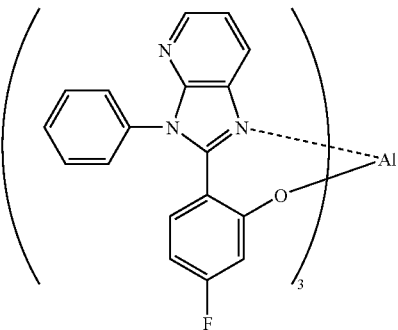
31
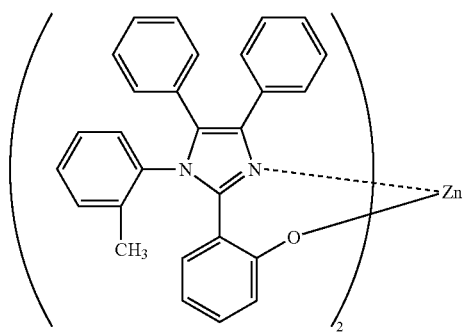
32
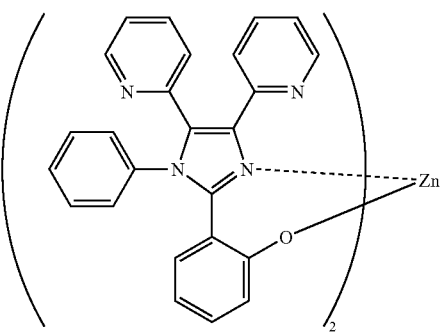
33
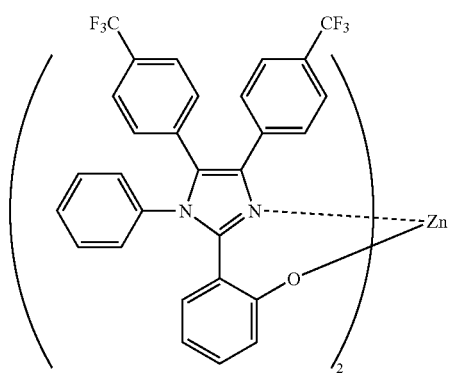
34
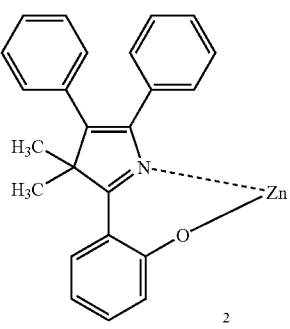
35
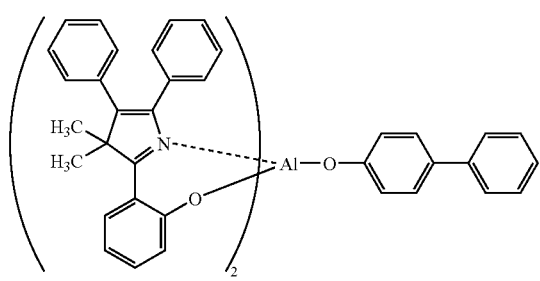
36
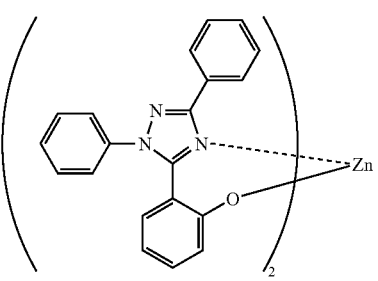

-continued
37
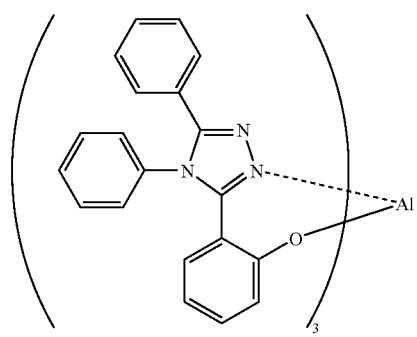
38
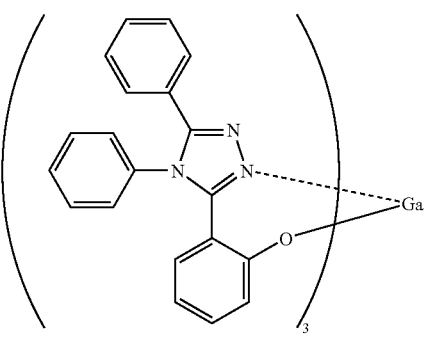
39
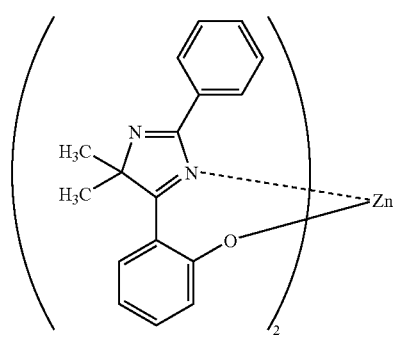
40
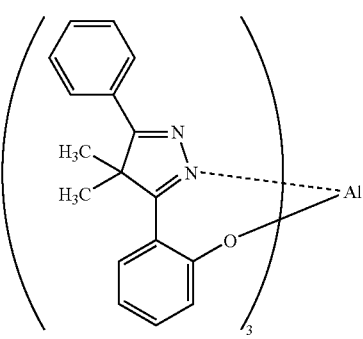
41
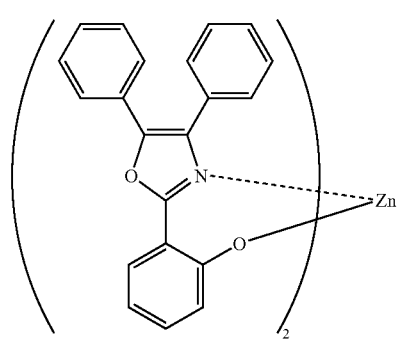
42
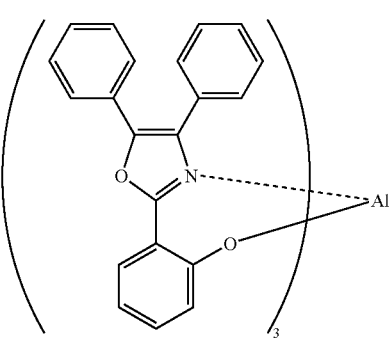
43
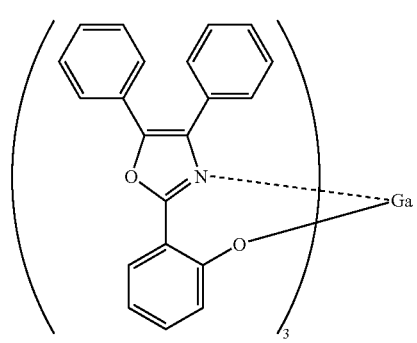
44
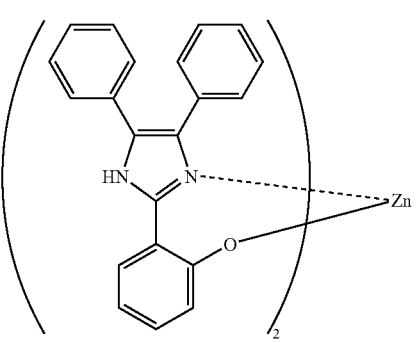

-continued
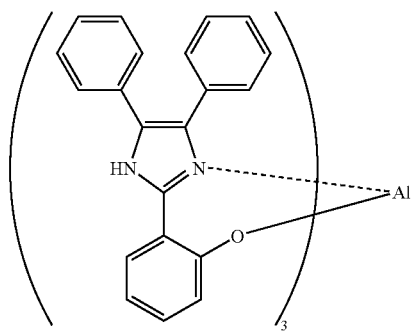
45
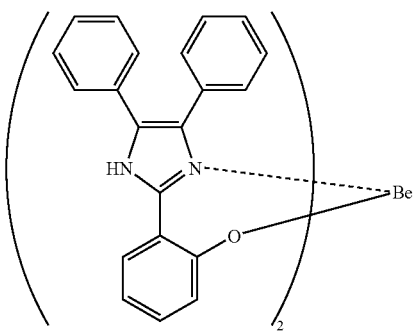
46
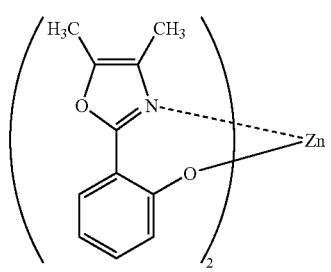
47
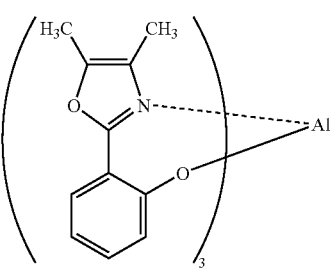
48
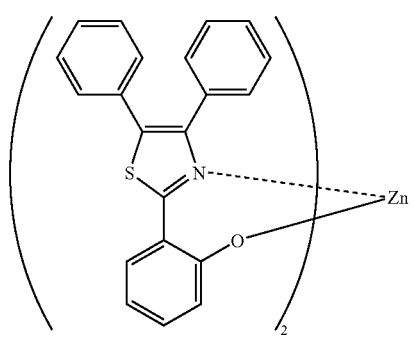
49
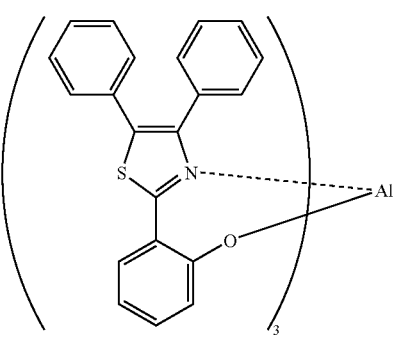
50
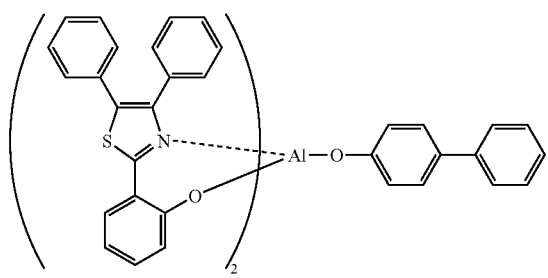
51
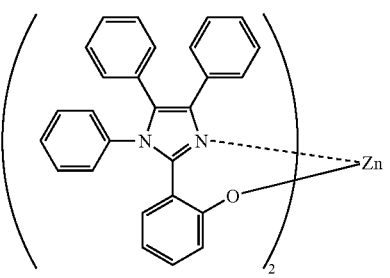
52
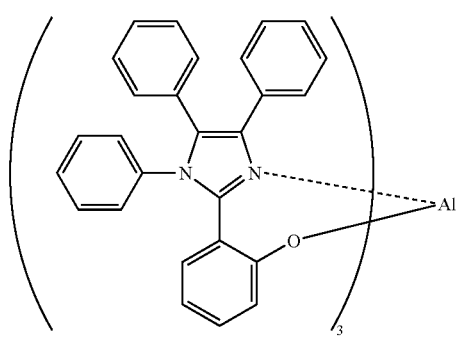
53
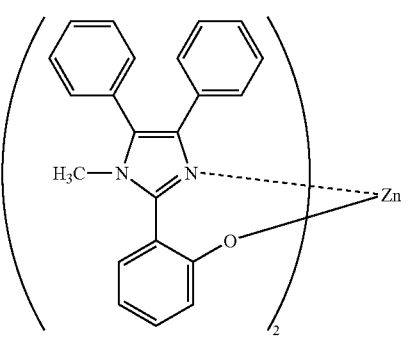
54

-continued

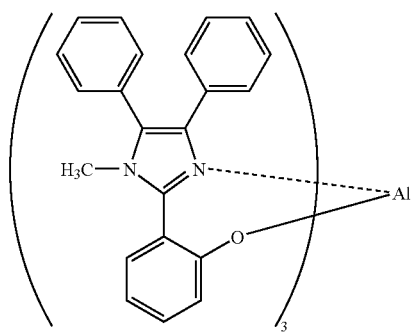
55

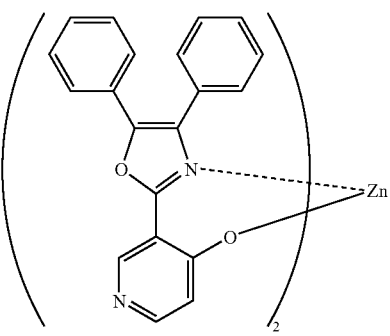
56

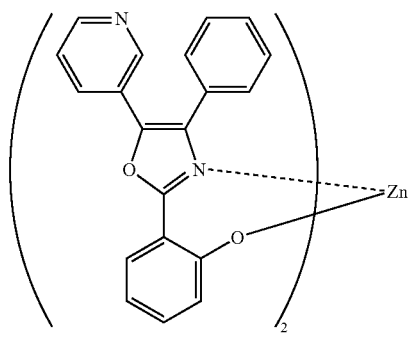
57

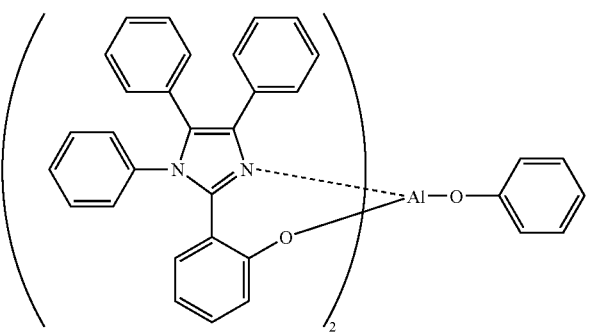
58

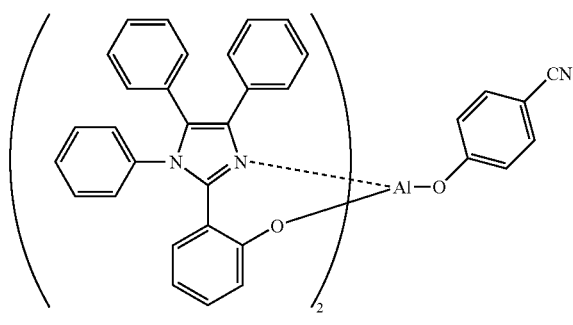
59

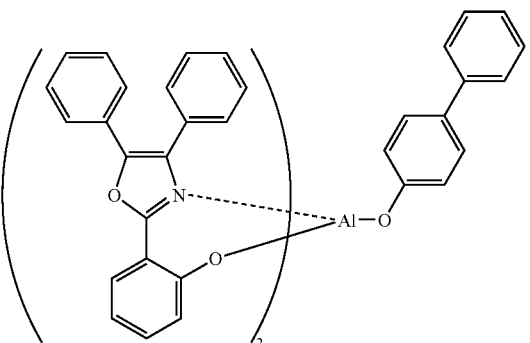
60

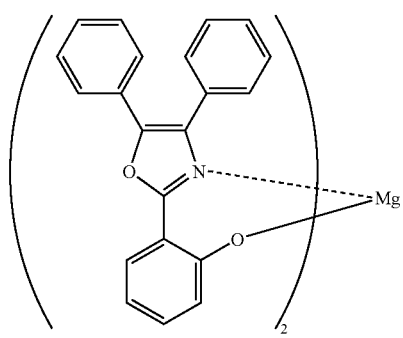
61

A preferred second embodiment of the organic EL device of the invention is an embodiment containing a compound represented by the formula (V) in the luminescent layer, which preferably functions as a host material. In the formula (V) $R^{53}$ represents a hydrogen atom or a substituent. $X^{51}$ represents a nitrogen atom or C—$R^{51}$. $X^{52}$ represents a nitrogen atom or C—$R^{52}$. $R^{51}$ and $R^{52}$ each represents a hydrogen atom or a substituent. $Z^5$ represents an atomic group necessary for forming a 5-membered or 6-membered ring including an atom to which a dotted line in the formula is bound. $M^5$ represents a metal ion. $n^5$ represents an integer of 1 or more. $L^5$ represents a ligand, and $m^5$ represents an integer of 0 or more.

$R^{53}$ represents a hydrogen atom or a substituent. As the substituent, those enumerated as the substituent to be substituted on the aryl group represented by $R^{11}$ and $R^{12}$ or on the heterocyclic ring formed upon connection between $R^{11}$ and $R^{12}$ in the formula (I) can be applied. R is preferably a hydrogen atom, an alkyl group, an aryl group, or an aromatic heterocyclic group; more preferably an alkyl group, an aryl group, or an aromatic heterocyclic group; and further preferably an aryl group.

$X^{51}$ represents a nitrogen atom or C—$R^{51}$, and $X^{52}$ represents a nitrogen atom or C—$R^{52}$. $R^{51}$ and $R^{52}$ each represents a hydrogen atom or a substituent. $R^{51}$ and $R^{52}$ may be bonded to each other to form a 5-membered or 6-membered heterocyclic ring, an aryl group, or a heteroaryl group. As the substituent, those enumerated as the substituent to be substituted on the aryl group represented by $R^{11}$ and $R^{12}$ or on the heterocyclic ring formed upon connection between $R^{11}$ and $R^{12}$ in the formula (I) can be applied. $R^{51}$ and $R^{52}$ are each preferably a hydrogen atom, an alkyl group, an aryl group, an aromatic heterocyclic group, a group capable of forming an aromatic hydrocarbon ring upon bonding to each other, or a group capable of forming an aromatic heterocyclic ring upon bonding to each other; more preferably a hydrogen atom, an alkyl group, an aryl group, a group capable of forming an aromatic hydrocarbon ring upon bonding to each other, or a group capable of forming an aromatic heterocyclic ring upon bonding to each other; and further preferably a hydrogen atom, an aryl group, or a group capable of forming an aromatic heterocyclic ring upon bonding to each other.

$Z^5$, $M^5$, $L^5$, $n^5$, and $m^5$ are respectively synonymous with $Z^1$, $M^1$, $L^1$, $n^1$, and $m^1$ in the formula (I), and preferred examples thereof are also the same.

Specific examples represented by the formula (V) will be given below, but it should not be construed that the invention is limited thereto.

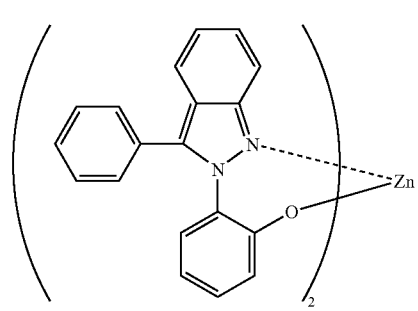
62

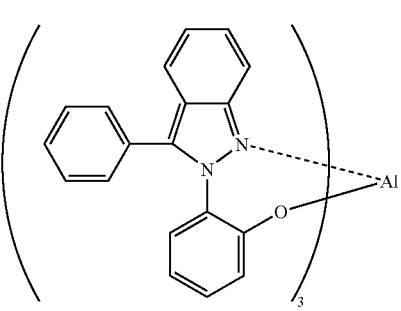
63

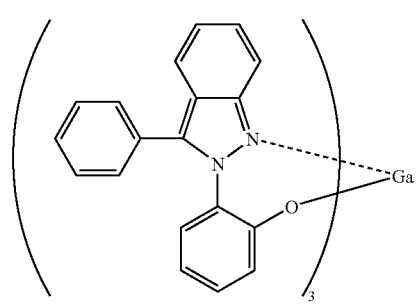
64

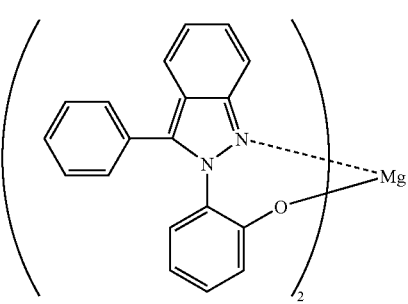
65

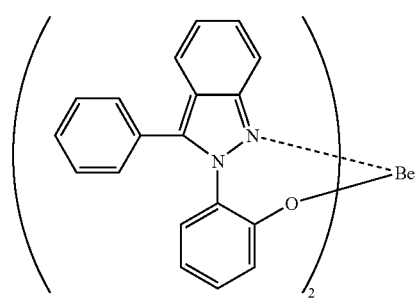
66

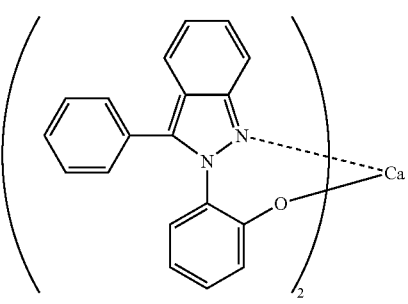
67

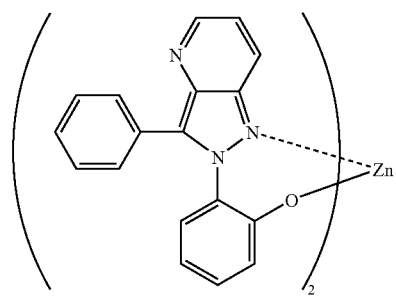
68

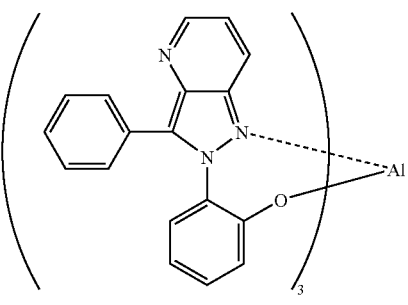
69

-continued
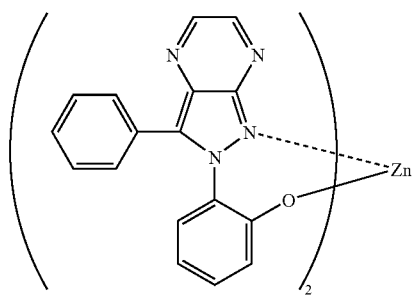
70
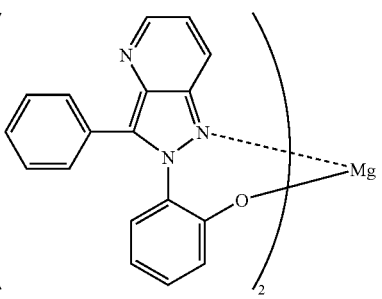
71
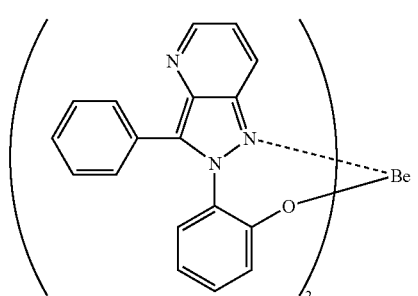
72
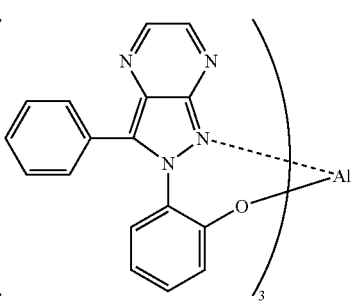
73
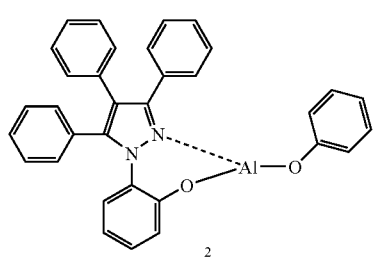
74
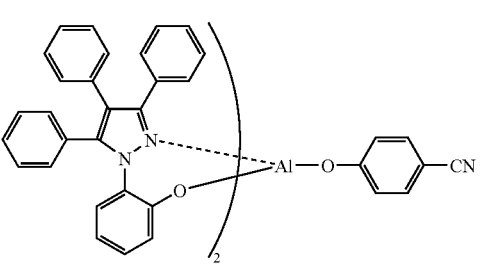
75
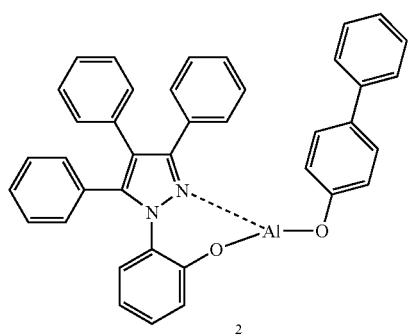
76
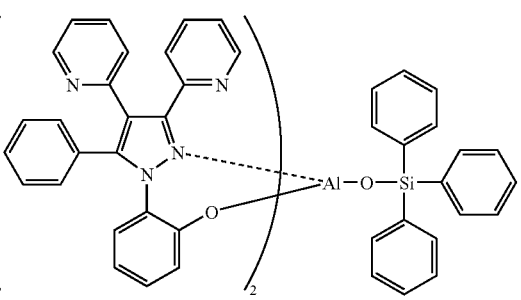
77
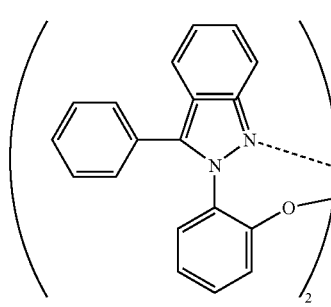
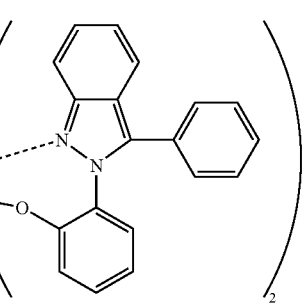
78

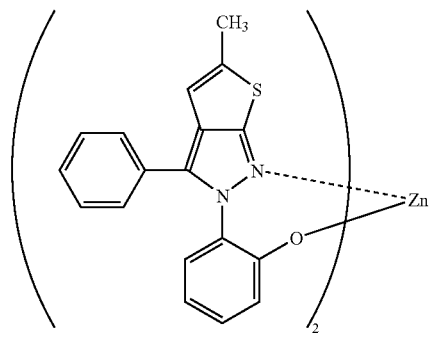
79
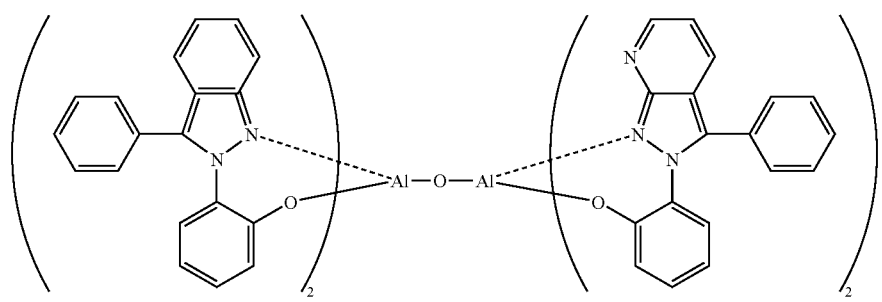
80
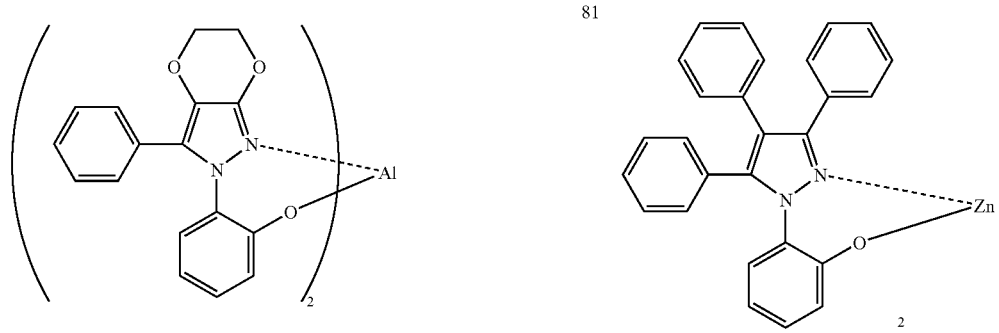
81
82
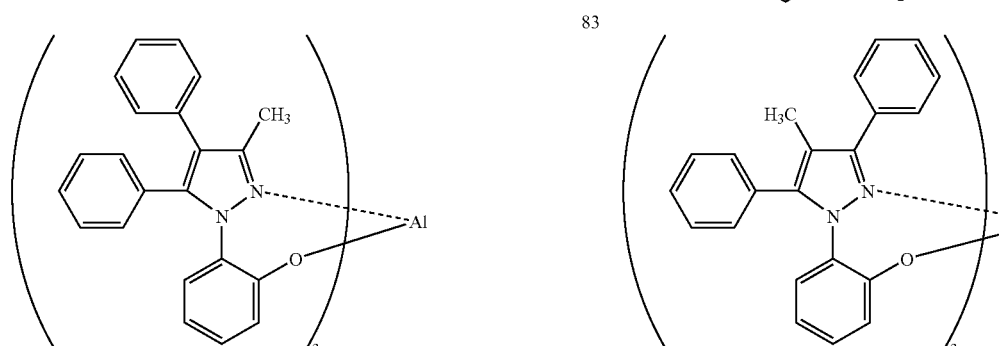
83
84
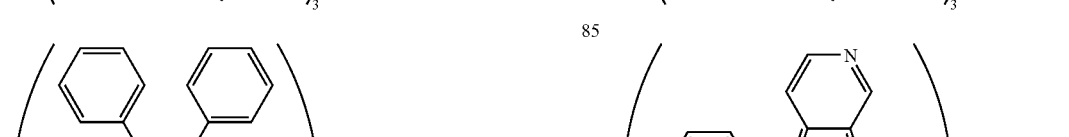
85
86
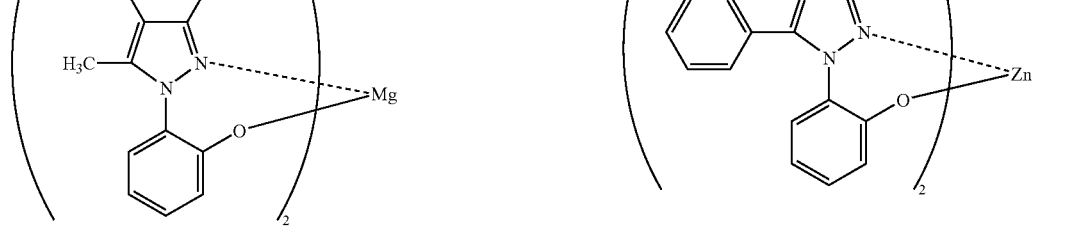

-continued
87
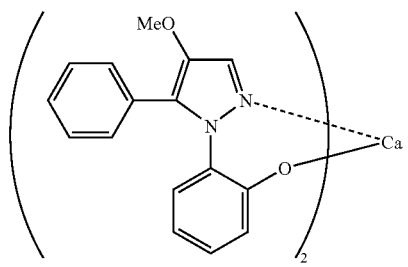
88
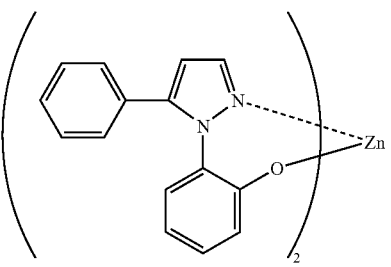
89
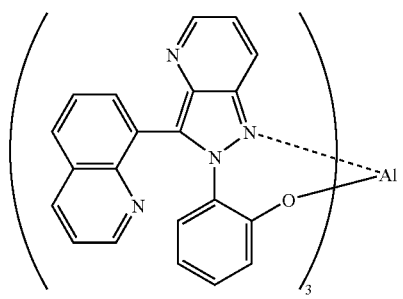
90
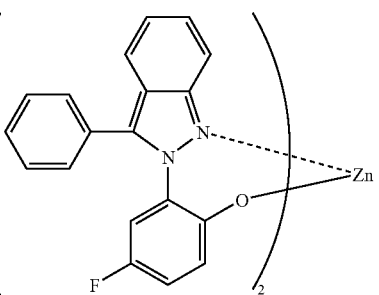
91
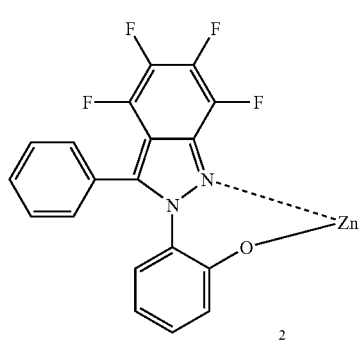
92
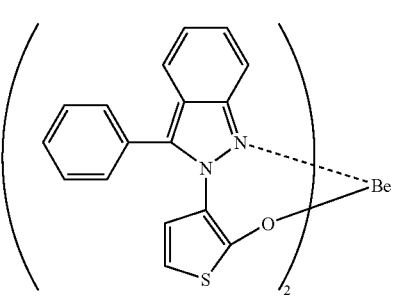
93
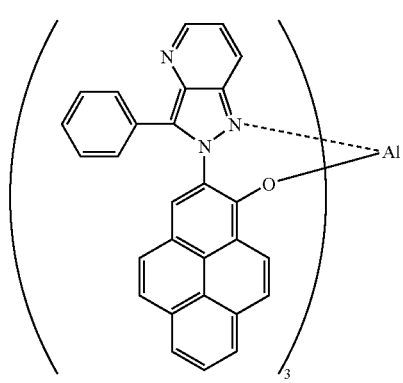
94
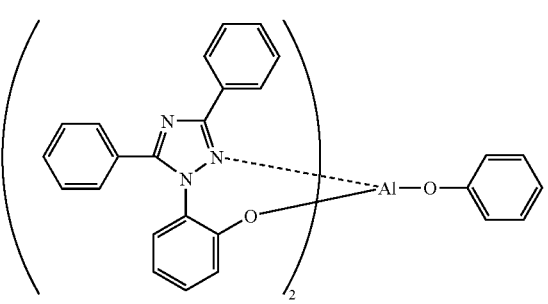
95
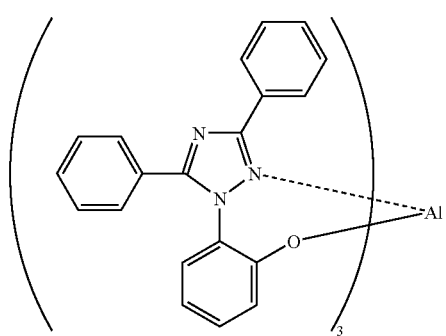
96
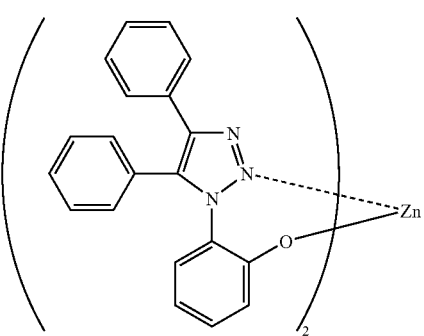

-continued

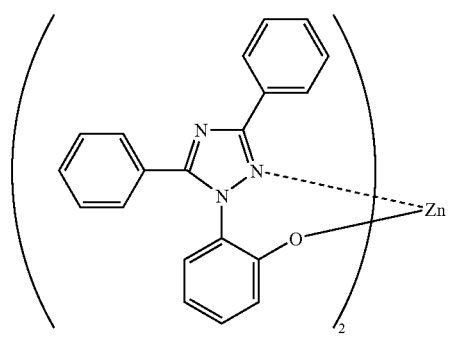
97

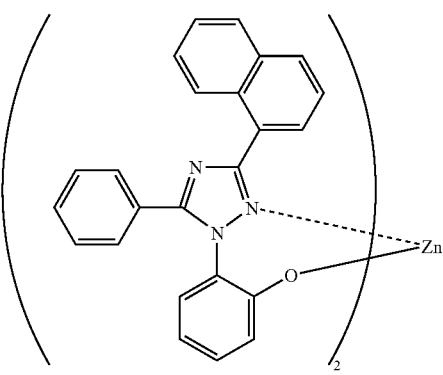
98

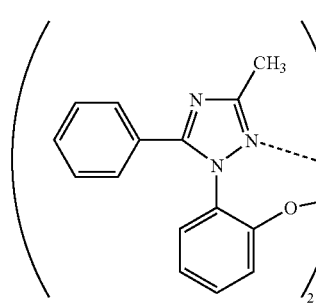
99

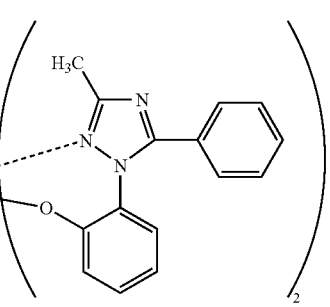
100

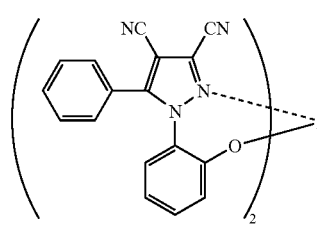
101

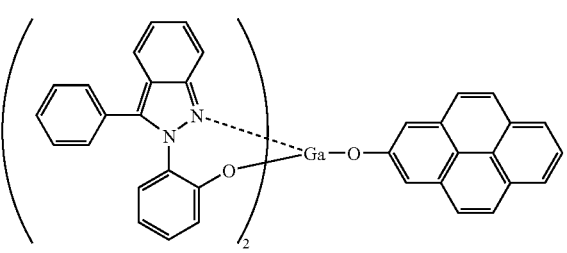
102

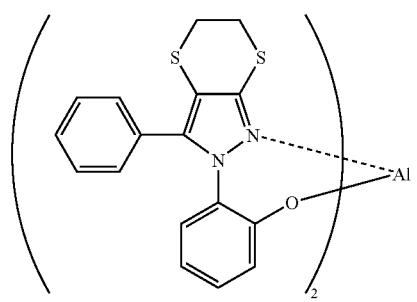

The organic EL device of the invention utilizes luminescence from the triplet excited states using a phosphorescent material as a guest material in the luminescent layer. The luminescence from the triplet excited states is synonymous with phosphorescence. The material capable of emitting phosphorescence will be hereinafter referred to as a "phosphorescent material". The luminescent material of the invention contains at least one phosphorescent material. Though the phosphorescent material to be used in the invention is not particularly limited, it is preferably a transition metal complex. Though a central metal of the transition metal complex is not particularly limited, it is preferably iridium, platinum, rhenium, or ruthenium; more preferably iridium or platinum; and especially preferably iridium. Of the transition metal complexes, orthometalated complexes are preferable, and orthocarbometalated complexes are more preferable. The "orthometalated complex" as referred to herein is a general term of compound groups described in Akio Yamamoto, *Yukikinzoku: Kiso To Oyo* (Organometallics: Base and Application), page 150 and page 232, Shokabo (1982) and H. Yersin, *Photochemistry and Photophysics of Coordination Compound*, pages 71 to 77 and pages 135 to 146, Springer-Verlag (1987), etc.

The luminescent device of the invention is characterized in that the luminescent layer contains a phosphorescent material as the luminescent material and a metal complex material as the host material. The phosphorescent material may be used singly or in admixture of two or more thereof, and the host material may be used singly or in admixture of two or more thereof.

In the organic EL device of the invention, it is preferable that the luminescent layer is constituted of only the phosphorescent material and the compound represented by the formula (I) or formula (V). The content ratio (weight ratio) of the compound represented by the formula (I) or formula (V) to the phosphorescent material in the luminescent layer is preferably from 50/50 to 99.99/0.01, more preferably from 70/30 to 99.9/0.1, and further preferably from 80/20 to 99/1.

The phosphorescent material preferably has a phosphorescent quantum yield at 20° C. or higher of 70% or more, more preferably 80% or more, and further preferably 85% or more.

The phosphorescence life (at room temperature) of the phosphorescent material of the present invention is not specifically restricted, and is preferably 1 ms or shorter, more preferably 100 µs or shorter, and still more preferably 10 µs or shorter.

As the phosphorescent material, those described in patent documents such as U.S. Pat. No. 6,303,231 B1, U.S. Pat. No. 6,097,147, WO 00/57676, WO 00/70655, WO 01/08230, WO 01/39234 A2, WO 01/41512 A1, WO 02/02714 A2, WO 02/15645 A1, JP-A-2001-247859, Japanese Patent Application Nos. 2000-33561, 2001-189539, 2001-248165, 2001-33684, 2001-239281 and 2001-219909, European Patent No. 1,211,257, JP-A-2002-226495, JP-A-2002-234894, JP-A-2001-247859, JP-A-2001-298470, JP-A-2002-173674, JP-A-2002-203678, and JP-A-2002-203679; and non-patent documents such as *Nature*, Vol. 395, 151 (1998), *Applied Physics Letters*, Vol. 75, 4 (1999), *Polymer Preprints*, Vol. 41, 770 (2000), *Journal of American Chemical Society*, Vol. 123, 4304 (2001), and *Applied Physics Letters*, Vol. 79, 2082 (1990) can be suitably utilized.

There are no particular limitations with respect to the system, driving method, and utilization embodiment of the luminescent device of the invention.

The formation method of the organic compound layer in the luminescent device of the invention is not particularly limited. Examples include resistance heating vapor deposition method, electrophotography method, electron beam method, sputtering method, molecular lamination method, coating method (such as spray coating, dip coating, impregnation, roll coating, gravure coating, reverse coating, roll brush coating, air knife coating, curtain coating, spin coating, flow coating, bar coating, micro-gravure coating, air doctor coating, blade coating, squeeze coating, transfer roll coating, kiss coating, cast coating, extrusion coating, wire bar coating, and screen coating), ink-jet method, printing method, and transfer method. Above all, taking into consideration characteristics of device, easiness of manufacture, costs, etc., resistance heating vapor deposition method, coating method, and transfer method are preferable. In the case where the luminescent layer has a multilayered structure of two or more layers, the device can be manufactured by combing the foregoing methods.

In the case of the coating method, the organic compounds can be dissolved or dispersed together with a resin component. Examples of the resin component include poly (vinyl chloride)s, polycarbonates, polystyrenes, polymethyl methacrylates, polyesters, polysulfones, polyphenylene oxides, polybutadienes, poly (N-vinylcarbazole)s, hydrocarbon resins, ketone resins, phenoxy resins, polyamides, ethyl celluloses, poly(vinyl acetate)s, ABS resins, polyurethanes, melamine resins, unsaturated polyester resins, alkyd resins, epoxy resins, and silicone resins.

Though the luminescent device of the invention contains at least the luminescent layer, it may contain other organic layer such as a hole injection layer, a hole transport layer, an electron injection layer, an electron transport layer, and a protective layer. Also, each of these layers may have other function at the same time. Details of each of the layers will be described below.

As materials of the hole injection layer and hole transport layer, any materials having any one of a function to inject holes from an anode, a function to transport holes, or a function to block electrons injected from a cathode are employable. Specific examples include carbazoles, imidazoles, triazoles, oxazoles, oxadiazoles, polyarylalkanes, pyrazolines, pyrazolones, phenylenediamines, arylamines, amino-substituted chalcones, styrylanthracenes, fluorenones, hydrazones, stilbenes, silazanes, aromatic tertiary amine compounds, styrylamines, aromatic dimethylidene compounds, porphyrin based compounds, conductive polymer and oligomer such as polysilane based compounds, poly(N-vinylcarbazole)s, aniline based copolymers, thiophene oligomers, and polythiophenes, organometallic complexes, transition metal complexes, and derivatives of the foregoing compounds.

Though the film thickness of the hole injection layer and hole transport layer is not particularly limited, in general, it is preferably in the range of from 1 nm to 5 µm, more preferably in the range of from 5 nm to 1 µm, and further preferably in the range of from 10 nm to 500 nm. Each of the hole injection layer and the hole transport layer may be of a single layer structure made of one or two or more kinds of the foregoing materials, or may be of a multilayered structure comprising a plurality of layers of the same formation or a different component from each other.

As materials of the electron injection layer and electron transport layer, any materials having any one of a function to inject electrons from a cathode, a function to transport electrons, or a function to block hole injected from an anode are employable. Specific examples include triazoles, triazines, oxazoles, oxadiazoles, fluorenones, anthraquinodimethane, anthrone, diphenylquinone, thiopyran dioxide, carbodimide, fluorenylidenemethane, distyrylpyrazine, silole, tetracarboxylic acid anhydrides of aromatic ring compound such as naphthalene and perylene, various metal complexes represented by metal complexes such as phthacyanine and 8-quinolinol derivatives and metal complexes comprising metal phthalocyanine, benzoxazole or benzothiazole as a ligand, and derivatives of the foregoing compounds.

Though the film thickness of the electron injection layer and electron transport layer is not particularly limited, in general, it is preferably in the range of from 1 nm to 5 µm, more preferably in the range of from 5 nm to 1 µm, and further preferably in the range of from 10 nm to 500 nm. Each of the electron injection layer and the electron transport layer may be of a single layer structure made of one or two or more kinds of the foregoing materials, or may be of a multilayered structure comprising a plurality of layers of the same formulation or a different formation from each other.

In the invention, though the luminescent layer contains at least one phosphorescent material and at least one metal complex, other plural materials may be used jointly. Examples of materials that are used in the luminescent layer include benzoxazole, benzimidazole, benzothiazole, styrylbenzene, polyphenyl, diphenylbutadiene, tetraphenylbutadiene, naphthalimide, coumarin, perylene, perinone, oxadiazole, aldazine, pyrralizine, cyclopentadiene, bisstyrylanthracene, quinacridone, pyrropyridine, thiadiazolopyridine, styrylamine, aromatic dimethylidene compounds, polymer compounds such as polythiophene, polyphenylene, and polyphenylene vinylene, and derivatives of the foregoing derivatives.

The luminescent layer may be of a single layer structure or a multilayered structure of two or more layers. In the case where the luminescent layer is of a multilayered structure, the respective layers may have a different luminescent color from each other. Even in the case where the luminescent layer is of a multilayered structure, it is preferable that the respective layers are constituted of only a phosphorescent material and a metal complex. Though the film thickness of the luminescent layer is not particularly limited, in general, it is preferably in the range of from 1 nm to 5 μm, more preferably in the range of from 5 nm to 1 μm, and further preferably in the range of from 10 nm to 500 nm.

As materials of the protective layer, any materials having a function to retard the matter that substances of likely promoting degradation of the device, such as water and oxygen, enter the device are employable. Specific examples include metals (such as In, Sn, Pb, Au, Cu, Ag, Al, Ti, and Ni), metal oxides (such as MgO, SiO, $SiO_2$, $Al_2O_3$, GeO, NiO, CaO, BaO, $Fe_2O_3$, $Y_2O_3$, and $TiO_2$), metal fluorides (such as $MgF_2$, LiF, $AlF_3$, and $CaF_2$), polyethylene, polypropylene, polymethyl methacrylate, polyimides, polyureas, polytetrafluoroethylene, polychlorotrifluoroethylene, polydichlorodifluoroethylene, a copolymer of chlorotrifluoroethylene and dichlorodifluoroethylene, copolymers obtained by copolymerizing a monomer mixture of ethylene and at least one comonomer, fluorine-containing copolymers having a cyclic structure in the copolymerization main chain, water absorbing substances having a coefficient of water absorption of 1% or more, and moisture-proofing substances having a coefficient of water absorption of not more than 0.1%. The formation method of the protective layer is not particularly limited. Examples include vacuum vapor deposition method, sputtering method, reactive sputtering method, MBE (molecular beam epitaxy) method, cluster ion beam method, ion plating method, plasma polymerization method (high-frequency ion plating method), plasma CVD method, laser CVD method, heat CVD method, gas source CVD method, coating method, inkjet method, printing method, transfer method, and electrophotography method.

The anode feeds holes into the hole injection layer, the hole transport layer, the luminescent layer, etc. As the anode, metals, alloys, metal oxides, electroconductive compounds, or mixtures thereof can be used. Of these, materials having a work function of 4 eV or more are preferable. Specific examples include conductive metal oxides such as tin oxide, zinc oxide, indium oxide, and indium-tin oxide (ITO); metals such as gold, silver, chromium, and nickel; mixtures or laminates of the foregoing metals and conductive metal oxides; inorganic conductive substances such as copper iodide and copper sulfide; organic conductive materials such as polyaniline, polythiophene, and polypyrrole; and mixtures or laminates thereof with ITO. Of these, conductive metal oxides are preferable, and ITO is especially preferable from the viewpoints of productivity, high conductivity, and transparency. Though the film thickness of the anode can be properly chosen according to the material, in general, it is preferably in the range of from 10 nm to 5 μm, more preferably from 50 nm to 1 μm, and further preferably from 100 nm to 500 nm.

As the anode, a layer formed on a substrate such as a soda lime glass, an alkali-free glass, and a transparent resin is used. In the case of using a glass, with respect to the material quality, it is preferable to use an alkali-free glass for the sake of reducing ions eluted from the glass. Also, in the case of using a soda lime glass, it is preferable to use one on which a barrier coat such as silica is provided. The thickness of the substrate is not particularly limited so far as it is sufficient for keeping a mechanical strength. In the case of using a glass, in general, ones having a thickness of 0.2 mm or more, and preferably 0.7 mm or more are used. For preparation of the anode, various methods can be employed according to the material. For example, in the case of ITO, the film formation is carried out by electron beam method, sputtering method, resistance heating vapor deposition method, ion plating method, chemical reaction method (such as sol-gel method), spraying method, dipping method, heat CVD method, plasma CVD method, coating of ITO dispersion, etc. In the anode, it is possible to lower the driving voltage of the device and enhance luminous efficiency by rinsing or other treatment. For example, in the case of ITO, UV-ozone treatment, plasma treatment, etc. are effective.

The cathode feeds electrons into the electron injection layer, the electron transport layer, the luminescent layer, etc. and is chosen taking into consideration adhesiveness to an adjacent layer to the cathode, such as the electron injection layer, the electron transport layer, and the luminescent layer, ionization potential, stability, etc. As materials of the cathode, metals, alloys, metal oxides, electroconductive compounds, or mixtures thereof can be employed. Specific examples include alkali metals (such as Li, Na, K, and Cs) or fluorides thereof, alkaline earth metals (such as Mg and Ca) or fluorides thereof, gold, silver, lead, aluminum, a sodium-potassium alloy or mixed metals thereof, a lithium-aluminum alloy or mixed metals thereof, a magnesium-silver alloy or mixed metals thereof, and rare earth metals such as indium and ytterbium. Of these, materials having a work function of not more than 4 eV are preferable; and aluminum, a lithium-aluminum alloy or mixed metals thereof, and a magnesium-silver ally or mixed metals thereof are more preferable. Though the film thickness of the cathode can be properly chosen according to the material, in general, it is preferably in the range of from 10 nm to 5 μm, more preferably from 50 nm to 1 μm, and further preferably from 100 nm to 1 μm. For forming the cathode, electron beam method, sputtering method, resistance heating vapor deposition method, coating method, etc. can be employed. A single metal can be subjected to vapor deposition, or two or more components can be subjected to vapor deposition at the same time. Further, it is possible to subject plural metals to vapor deposition at the same time to form an alloy electrode. Also, an alloy having been prepared in advance may be subjected to vapor deposition. It is preferable that the sheet resistance of the anode and cathode is low, and it is preferably less than several hundreds $\Omega/\square$ ($\Omega$/square).

The organic layer of the luminescent device of the invention is preferably of a three-layer structure of a hole transport layer, a luminescent layer and an electron transport layer, or a four-layer structure of a hole transport layer, a luminescent layer, a hole block layer and an electron transport layer.

The luminescent device of the present invention can enhance light extraction efficiency with various, publicly known measures. It is possible to enhance external quantum efficiency by improving light extraction efficiency, for example, by the following measures; processing the surface configuration of the substrate (for example, formation of fine concavo-convex patterns); control of the refractive indices of the substrate, the ITO layer and the organic layers; regulation of the thicknesses of the substrate, the ITO layer and the organic layers, etc.

The luminescent device of the present invention may also be of so-called top emission type in which the emitted light is taken out from the cathode side.

The substrate material used for the luminescent device of the invention is not specifically restricted, including inorganic materials such as zirconia-stabilized yttrium, glass, etc., polymer materials such as polyesters exemplified by poly(ethylene terephthalate), poly(butylene terephthalate), poly(ethylene naphthalate), etc., polyethylene, polycarbonate, polyether sulfone, polyallylate, allyl diglycol carbonate, polyimide, polycyclo-olefin, norbornene resin, poly(chlorotrifluoroethylene), teflon, polytetrafluoroethylene-polyethylene copolymer, etc.

The luminescent layer of the organic electroluminescent device in accordance with the present invention may include at least one stacked layer structure. The number of the stacked layers may be preferably from 2 to 50, more preferably from 4 to 30, and still more preferably from 6 to 20.

The thickness of each layer constituting the stacked layer structure is not specifically limited, and is preferably from 0.2 nm to 20 nm, more preferably from 0.4 nm to 15 nm, still more preferably from 0.5 nm to 10 nm, and especially preferably from 1 nm to 5 nm.

The luminescent layer in the organic electroluminescent device of the present invention may have a plurality of domain structures. The luminescent layer may further contain another type of domain structure. The size of such individual domains is preferably from 0.2 nm to 10 nm, more preferably from 0.3 nm to 5 nm, still more preferably from 0.5 nm to 3 nm, and especially preferably from 0.7 nm to 2 nm.

The organic EL device of the invention can be suitably utilized for display device, display, backlight, electrophotography, lighting light source, recording light source, exposure light source, reading light source, sign, signboard, interior, optical communication, etc.

EXAMPLES

The invention will be described below in more detail with reference to the Examples, but it should not be construed that the invention is limited thereto.

Comparative Example 1

A rinsed ITO substrate was placed in a vapor deposition unit and subjected to vapor deposition successively with TPD (N,N'-diphenyl-N,N'-di(m-tolyl)bendizine) in 50 nm, a mixture of Alq and Ir(ppy)$_3$ (weight ratio: 17/1) in 36 nm and the following Compound a in 36 nm. A patterned mask (luminescent area: 4 mm×5 mm) was placed on the resulting organic thin film and subjected to vapor deposition successively with lithium fluoride in 3 nm and aluminum in 60 nm. There was thus prepared an organic EL device of Comparative Example 1.

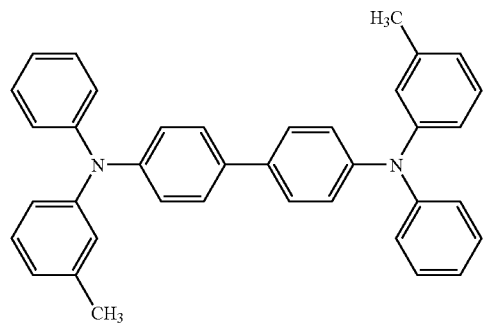

TPD

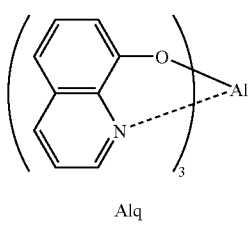

Alq

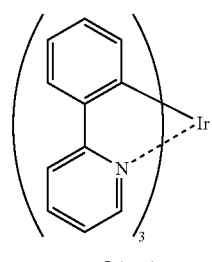

Ir(ppy)$_3$

Compound a

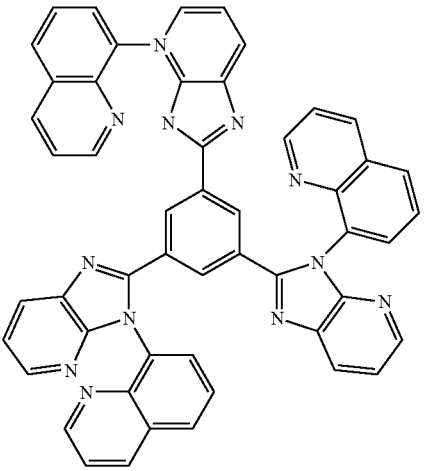

To the resulting organic EL device, a direct current constant voltage was applied for luminescence using a source measure unit 2400 manufactured by TOYO Corporation. The luminance was measured using a luminance meter BM-8 manufactured by Topcon Corporation, and the luminescence wavelength and CIE chromaticity coordinate were measured using a spectral analyzer PMA-11 manufactured by Hamamatsu Photonics K.K. As a result, green luminescence having a CIE chromaticity of (x, y)=(0.324, 0.557) and a luminescent peak wavelength of 530 nm was obtained. The maximum luminance was 1,300 cd/m², and the external quantum efficiency was 0.22%.

Comparative Example 2

An organic EL device of Comparative Example 2 was prepared in the same manner as in Comparative Example 1, except for using the following Compound CBP in place of Alq. The organic EL device of Comparative Example 2 was evaluated in the same manner as in Comparative Example 1. As a result, green luminescence having a CIE chromaticity of (x, y)=(0.276, 0.630) and a luminescent peak wavelength of 516 nm was obtained. The maximum luminance was 27,000 cd/m², and the external quantum efficiency was 12.7%.

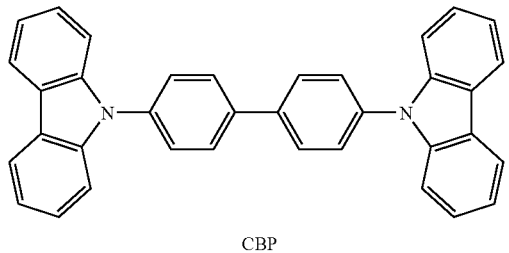

CBP

Comparative Example 3

An organic EL device of Comparative Example 3 was prepared in the same manner as in Comparative Example 1, except for using the following Compound H-4 (the Compound (H-4) described in paragraph No. [0034] of JP-A-2002-305083) in place of Alq. The organic EL device of Comparative Example 3 was evaluated in the same manner as in Comparative Example 1. As a result, green luminescence having a CIE chromaticity of (x, y)=(0.286, 0.624) and a luminescent peak wavelength of 522 nm was obtained. The maximum luminance was 21,000 cd/m², and the external quantum efficiency was 11.4%.

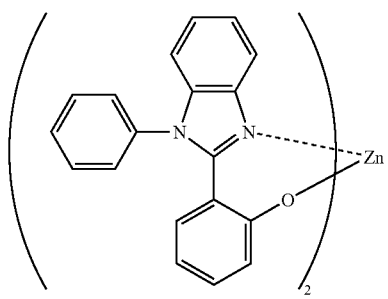

H-4

Example 1

An organic EL device of Example 1 was prepared in the same manner as in Comparative Example 1, except for using the Illustrative Compound 1 in place of Alq. The organic EL device of Example 1 was evaluated in the same manner as in Comparative Example 1. As a result, green luminescence having a CIE chromaticity of (x, y)=(0.320, 0.615) and a luminescent peak wavelength of 524 nm was obtained. The maximum luminance was 83,000 cd/m², and the external quantum efficiency was 19.7%.

Example 2

An organic EL device of Example 2 was prepared in the same manner as in Comparative Example 1, except for using the Illustrative Compound 2 in place of Alq. The organic EL device of Example 2 was evaluated in the same manner as in Comparative Example 1. As a result, green luminescence having a CIE chromaticity of (x, y)=(0.300, 0.621) and a luminescent peak wavelength of 517 nm was obtained. The maximum luminance was 53,000 cd/m², and the external quantum efficiency was 23.1%.

Example 3

An organic EL device of the type set forth in Example 2 was fabricated in the same manner as in the foregoing Comparative Example 1 except that Illustrative Compound 4 was used instead of Alq. The organic EL device of Example 3 was evaluated in the same manner as in Comparative Example 1, giving a green luminescence with a CIE chromaticity of (x, y)=(0.30, 0.631) and with a luminescent peak wavelength at 517 nm. Further, the maximum luminance was 64,000 cd/m² and the external quantum efficiency was 23.9%.

Example 4

An organic EL device of the type set forth in Example 2 was fabricated in the same manner as in the foregoing Comparative Example 1 except that Illustrative Compound 21 was used instead of Alq. The organic EL device of Example 4 was evaluated in the same manner as in Comparative Example 1, resulting in a green luminescence with a CIE chromaticity of (x, y)=(0.299, 0.619) and with a luminescent peak wavelength at 518 nm. Further, the maximum luminance was 46,000 cd/m² and the external quantum efficiency was 18.8%.

Example 5

In a vapor deposition apparatus was mounted a rinsed Ito substrate, on which TPD (N,N'-diphenyl-N,N'-di(m-tolyl) benzidine) was vapor deposited in a thickness of 50 nm. Further, on this deposited layer, Illustrative Compounds 1 and 2 and Ir(ppy)₃ were vapor deposited at a mixing mass ratio of 9:9:1 in a thickness of 36 nm. Still further, Compound a was vapor deposited thereon in a thickness of 36 nm. On the organic thin film structure thus fabricated, a patterned mask (luminescent area: 4 mm×5 mm) was placed, and lithium fluoride was vapor deposited in a thickness of 3 nm followed by vapor deposition of aluminum in a thickness of 60 nm, thus providing an organic EL device of the type set forth in Comparative Example 1. The organic EL device of Example 5 was evaluated in the same manner as in Comparative Example 1, resulting in a green luminescence with a CIE chromaticity of (x, y)=(0.304, 0.630) and with a luminescent peak wavelength at 516 nm. Further, the maximum luminance was 72,000 cd/m² and the external quantum efficiency was 20.5%.

From the results on the foregoing Examples 1 to 5 together with Comparative Examples 1 to 3, it is evident that, in a phosphorescence-emitting organic EL device, when the metal complex of the invention is used as a host material, organic EL devices having more excellent luminance and efficiency than the conventional organic EL devices are obtained.

Example 6

In the organic EL devices of Examples 1-5 and Comparative Example 2, luminance half-life was measured while adapting the initial luminance. As a result, the organic EL device of Comparative Example 2 exhibited 8 hours. On the other hand, the organic EL device of Example 1 exhibited 85 hours; the organic EL device of Example 2 exhibited 79 hours; the organic EL device of Example 3 exhibited 111 hours; the organic EL device of Example 4 exhibited 59 hours; and the organic EL device of Example 5 exhibited 144 hours.

From the results of Example 6, it is noted that in phosphorescent organic EL devices, when the metal complex material of the invention is used, an organic EL device that is also excellent in driving durability is obtained.

Example 7

On a rinsed ITO substrate, Baytron P (a PEDOT-PSS (polyethylenedioxythiophene-polystyrenesulfonic acid doped material) dispersion, manufactured by Bayer AG) was coated by spin coating, followed by heat drying in vacuo at 100° C. for one hour, thereby providing a hole injection layer (film thickness: about 50 nm). A solution of 10 mg of the following Polycarbonate Resin Z, 25 mg of the Illustrative Compound 1 and 3 mg of Ir(ppy)$_3$ dissolved in 3 mL of dichloroethane was coated thereon by spin coating (at 2,000 rpm for 30 seconds). The organic layer had a total film thickness of 150 nm. A cathode was vapor deposited in the same manner as in Comparative Example 1, to prepare an organic EL device of Example 7. The organic EL device of Example 7 was evaluated in the same manner as in Comparative Example 1. As a result, green luminescence having a CIE chromaticity of (x, y)=(0.304, 0.630) and a luminescent peak wavelength of 516 nm was obtained. The maximum luminance was 23,500 cd/m$^2$ and the external quantum efficiency was 14.9%.

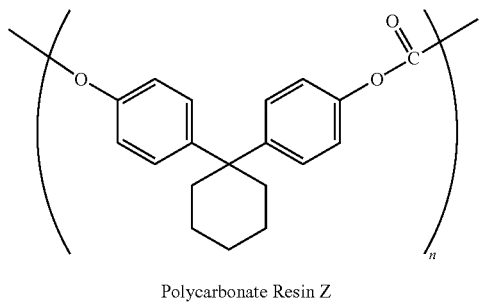

Polycarbonate Resin Z

From the results of Example 7, it is noted that in phosphorescent organic EL devices using the metal complex of the invention as a host material, even a device prepared by coating process provides a luminescent device having high luminance and high efficiency.

According to the invention, by using a metal complex having a specific structure of the invention as a host material in a luminescent layer, it is possible to provide luminescent devices exhibiting high luminance and high external quantum efficiency and having excellent durability. Also, since the metal complex of the invention can be provided for coating process, there are brought advantages such that the manufacturing process of luminescent layer can be made simple, energy required for the manufacture can be saved as compared with vapor deposition method, and man-hour can be made small.

This application is based on Japanese Patent application JP 2002-365280, filed Dec. 17, 2002, the entire content of which is hereby incorporated by reference, the same as if set forth at length.

What is claimed is:

1. An organic electroluminescent device comprising:
    a pair of electrode; and
    at least one organic layer between the pair of electrode, the at least one organic layer including a luminescent layer, wherein the luminescent layer contains at least one phosphorescent material and at least one compound represented by the formula (IV):

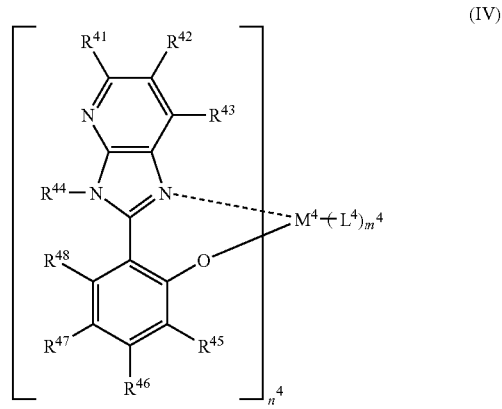

wherein $R^{41}$, $R^{42}$, and $R^{43}$ each represents a hydrogen atom or an alkyl group; $R^{44}$ represents an alkyl group, an aryl group or an aromatic heterocyclic group; $R^{45}$, $R^{46}$, $R^{47}$, and $R^{48}$ each represents a hydrogen atom, an alkyl group, a fluoro group or a perfluoro-substituted alkyl group; $M^4$ represents a divalent or trivalent metal ion; $n^4$ represents an integer of from 1 to 3; $L^4$ represents an alkoxy ion, an aryloxy ion or a silyloxy group; and $m^4$ represents an integer of from 0 to 2.

2. The organic electroluminescent device of claim 1, wherein a content of the compound of the formula (IV) is from 50% to 99.9% by weight in the luminescent layer.

3. The organic electroluminescent device of claim 1, wherein a content of the compound of the formula (IV) is from 60% to 99% by weight in the luminescent layer.

4. The organic electroluminescent device of claim 1, wherein $M^4$ represents $Be^{2+}$, $Mg^{2+}$, $Al^{3+}$, $Zn^{2+}$, $Ga^{3+}$ or $Cu^{2+}$ and $L^4$ represents an aryloxy ion or a silyloxy group.

* * * * *